(12) United States Patent
Makihara et al.

(10) Patent No.: US 8,344,929 B2
(45) Date of Patent: Jan. 1, 2013

(54) A/D CONVERTER DEVICE AND SIGNAL PROCESSING UNIT

(75) Inventors: Tetsuya Makihara, Nukata-gun (JP);
Masakiyo Horie, Gamagori (JP)

(73) Assignee: DENSO CORPORATION, Kariya (JP)

( * ) Notice: Subject to any disclaimer, the term of this patent is extended or adjusted under 35 U.S.C. 154(b) by 96 days.

(21) Appl. No.: 13/085,557

(22) Filed: Apr. 13, 2011

(65) Prior Publication Data

US 2011/0254716 A1      Oct. 20, 2011

(30) Foreign Application Priority Data

Apr. 15, 2010   (JP) ................................. 2010-093944

(51) Int. Cl.
*H03M 1/12*   (2006.01)
(52) U.S. Cl. ........................ 341/172; 341/155
(58) Field of Classification Search .................. 341/172, 341/155, 156, 122, 118, 120, 126, 127, 128, 341/136, 137, 161, 162, 163, 158, 159
See application file for complete search history.

(56) References Cited

U.S. PATENT DOCUMENTS 4,622,536 A * 11/1986 Shih et al. ..................... 341/108
7,746,261 B2    6/2010 Horie

FOREIGN PATENT DOCUMENTS

| JP | B2-06-28339 | 4/1994 |
| JP | A-2007-36580 | 2/2007 |
| JP | B2-4284851 | 4/2009 |

* cited by examiner

*Primary Examiner* — Joseph Lauture
(74) *Attorney, Agent, or Firm* — Posz Law Group, PLC

(57) ABSTRACT

An A/D converter device is provided, which has a D/A conversion function and changes a resolution of A/D conversion and D/A conversion. The A/D converter device is configured to selectively execute an A/D conversion operation and a D/A conversion operation, by the operation of a control circuit controlling switching of switches according to an ADC/DAC function switching signal supplied from an external side. The A/D conversion operation performs A/D conversion of an input signal voltage inputted via a signal input terminal from an external side and outputs an A/D conversion value of 12 bits. The D/A conversion operation outputs, via a signal output terminal, an analog voltage produced by performing D/A conversion of a digital value supplied from the external side.

11 Claims, 15 Drawing Sheets

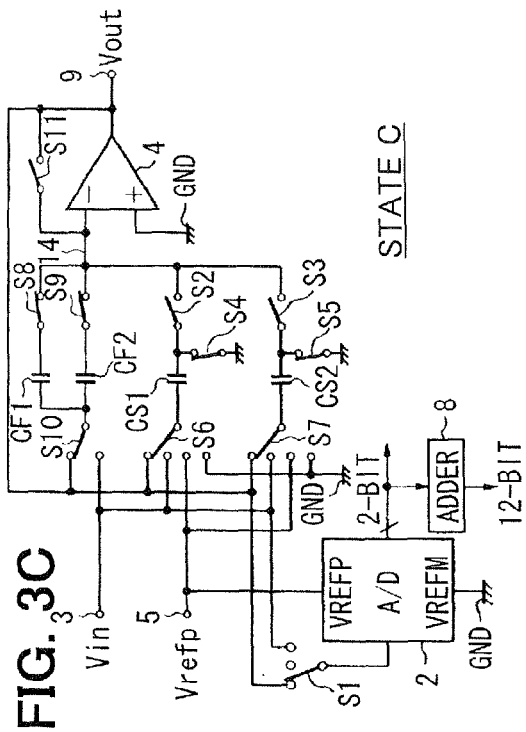
FIG. 3A STATE A
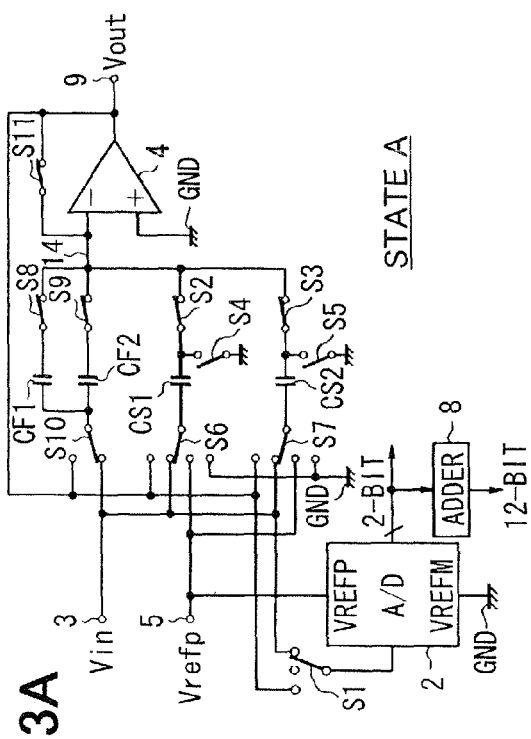
FIG. 3B STATE B
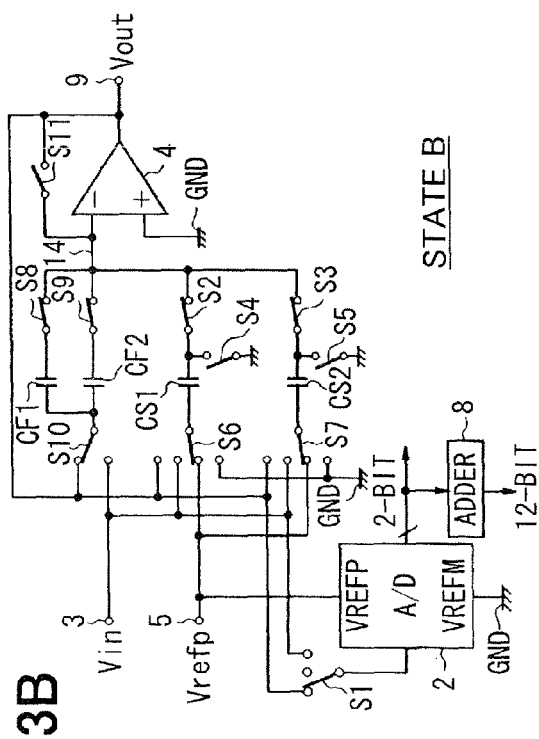
FIG. 3C STATE C

FIG. 4

| | 1st | 2nd | 3rd | 3rd | 4th | | 12th | |
|---|---|---|---|---|---|---|---|---|
| | A | B | C | B | C | | B | |
| S6, S7 | Vin | (Vrefp) or (Vrefm) | Vout | (Vrefp) or (Vrefm) | Vout | | (Vrefp) or (Vrefm) | |
| S10 | Vin | Vout | | | | | | |
| S11 | ON | OFF | | | | | | |
| S2, S3 | ON | OFF | ON | OFF | | | ON | |
| S8, S9 | ON | | | | | | | |
| S4, S5 | OFF | ON | OFF | ON | | | OFF | |
| S1 | Vin | Vout | | | | | | |
| CF1, CF2 | C·Vin | C·Vout(2) | C·Vout(3) | | | | C·Vout(12) | |
| CS1, CS2 | C·Vin | (C·Vrefp) or (C·Vrefm) | C·Vout(2) | (C·Vrefp) or (C·Vrefm) | C·Vout(3) | | (C·Vrefp) or (C·Vrefm) | |
| Vout | Vout(1)=0V | Vout(2)= 2·Vin−D(1)·Vrefp/2 | Vout(3)=2·Vout(2)− D(2)·Vrefp/2 | | | | Vout(12) | |
| A/D CODE | D(1) | D(2) | D(3) | | | | D(12) | |
| | t0 | t1 | t2 | t3 | t4 | t5 | t21 | t22 |

FIG. 5

| | 1.5-BIT A/D CODE | | VOLTAGE TO CS1 | VOLTAGE TO CS2 | Vout(N) |
|---|---|---|---|---|---|
| | BINARY | DECIMAL | | | |
| Vin (or Vout)<1.875V | 00 | 0 | Vrefm | Vrefm | 2·Vin or 2·Vout(N−1) |
| 1.875V<Vin (or Vout)<3.125V | 01 | 1 | Vrefp | Vrefm | 2·Vin−Vrefp/2 or 2·Vout(N−1)−Vrefp/2 |
| | | | Vrefm | Vrefp | |
| Vin (or Vout)>3.125V | 10 | 2 | Vrefp | Vrefp | 2·Vin−Vrefp or 2·Vout(N−1)−Vrefp |

FIG. 7

|  | A | B | C | B | C | B | C |
|---|---|---|---|---|---|---|---|
| S6 | Vrefp | Vout | | | | | |
| S7 | Vout | Vout | Vrefm | Vout | Vrefm | Vout | Vrefm |
| S10 | Vout | | | | | | |
| S11 | ON | OFF | | | | | |
| S2 | | ON | OFF | ON | OFF | ON | OFF |
| S3 | | ON | | | | | |
| S8 | ON | OFF | ON | OFF | ON | OFF | ON |
| S9 | ON | OFF | | | | | |
| S4, S5 | OFF | | | | | | |
| S1 | OPEN | | | | | | |
| CS1 | C·Vrefp | C·Vout(2) | | C·Vout(4) | | C·Vout(6) | |
| CS2 | 0 | C·Vout(2) | 0 | C·Vout(4) | 0 | C·Vout(6) | 0 |
| CF1 | 0 | | | C·Vout(3) | | C·Vout(5) | C·Vout(7) |
| CF2 | 0 | | | | | | |
| Vout | Vout(1) = 0V | Vout(2) = Vrefp/2 | Vout(3) = Vrefp/2 | Vout(4) = Vrefp/4 | Vout(5) = (3/4)Vrefp | Vout(6) = Vrefp/8 | Vout(7) = (7/8)Vrefp |
| A/D CODE | UNDEFINED | | | | | | |
| | SAMPLING | K1=1 | | K2=1 | | K3=1 | |

FIG. 15

| | A | B | D | B | C | B |
|---|---|---|---|---|---|---|
| S34, S35 | Vrefp | Vout | Vrefm | Vout | Vrefp | Vout |
| S31 | Vout | | | | | |
| S36 | ON | | OFF | | | |
| S32 | OFF | ON | OFF | ON | OFF | ON |
| S33 | ON | OFF | ON | OFF | ON | OFF |
| CS1, CS2 | C·Vrefp | C·Vout(2) | 0 | C·Vout(3) | C·Vrefp | C·Vout(4) |
| CF | 0 | 2C·Vout(2) | | 2C·Vout(3) | | 2C·Vout(4) |
| Vout | Vout(1)=0V | Vout(2)=Vrefp/2 | | Vout(3)=(1/4)Vrefp | | Vout(4)=(5/8)Vrefp |
| A/D CODE | | | UNDEFINED | | | |

A/D CODE ranges: K3=1 (LSB) | K2=0 | K1=1 (MSB)

A/D CONVERTER DEVICE AND SIGNAL PROCESSING UNIT

CROSS REFERENCE TO RELATED APPLICATION

This application is based on and incorporates herein by reference Japanese patent application No. 2010-93944 filed on Apr. 15, 2010.

FIELD OF THE INVENTION

The present invention relates to a cyclic A/D converter device and a signal processing unit provided with the cyclic A/D converter device.

BACKGROUND OF THE INVENTION

As a general output format of sensor devices, such as a pressure sensor device and a current sensor device, there are an analog output format and a digital output format. The former format outputs a signal outputted from a sensor element as an analog signal (generally in voltage) to the external side of the sensor device, after performing analog signal processing, such as amplification. The latter format outputs a signal outputted from a sensor element as a digital value to the external side of the sensor device, after performing analog-to-digital (A/D) conversion. Usually, a required output format of a sensor device differs according to an application, in which the sensor device is employed. Therefore, in the past, a circuit of the output stage is suitably designed according to the output format required, or, after mounting a circuit of the output stage, which is operable in both formats (a circuit for analog output, and a circuit for digital output), the circuit is selectively used, depending on the output format required. For this reason, cost for developing the circuit and cost for producing a chip, on which the circuit is fabricated, are increased, and also development period is increased.

Patent Document 1 discloses a sensor device, which employs a successive comparison A/D converter device, making it possible to integrate an analog output circuit and a digital output circuit into one device by using a digital-to-analog (D/A) converter circuit, which is a component of the A/D converter device. If such a sensor device is employed, it is possible to support both an analog output format and a digital output format. Accordingly, it is possible to realize a small-sized sensor device.

(Patent Document 1) JP Patent No. 4284851

Generally, according to the type of a sensor device and the type of application, in which the sensor device is employed, there are a variety of specifications of resolution of A/D conversion and D/A conversion. On the other hand, a successive approximation A/D converter device cannot change its resolution, without changing the circuit configuration thereof. Therefore, when adopting the technology disclosed in Patent Document 1, it is necessary to change the circuit configuration of a D/A converter circuit in the A/D converter device, according to the resolution required. That is, in the technology disclosed in Patent Document 1, it is necessary to change the circuit configuration according to the specifications of the resolution of A/D conversion and D/A conversion. Therefore, the development cost and the development period are necessarily increased.

SUMMARY OF THE INVENTION

It is therefore and object of the present invention to provide an A/D converter device, which has a D/A conversion function and includes an A/D converter circuit capable of changing resolution of A/D conversion and D/A conversion without alteration of circuit configuration.

It is a further object of the present invention to provide a signal processing unit, which incorporates such an A/D converter device therein.

According to one aspect of the present invention, an A/D converter device comprises an A/D converter circuit, a residual voltage generator circuit, an input switching circuit and a control circuit. The residual voltage generator circuit is operable to generate a residual voltage by amplifying a difference voltage of an input voltage and a predetermined analog voltage. The input switching circuit is operable to input one of an external signal voltage and a voltage outputted by the residual voltage generator circuit, to the A/D converter circuit and the residual voltage generator circuit. The control circuit is operable to control execution of an A/D conversion operation and a D/A conversion operation. The A/D conversion operation includes A/D conversion, which sets an analog voltage in the residual voltage generator circuit as a D/A conversion value of a digital conversion value outputted from the A/D converter circuit, and circulates the external signal voltage through the input switching circuit, the A/D converter circuit and the residual voltage generator circuit. The D/A conversion operation includes D/A conversion, which sets an analog voltage in the residual voltage generator circuit as a voltage corresponding to a binary code value supplied from an external side, circulates the analog voltage outputted from the residual voltage generator circuit through the input switching circuit and the residual voltage generator circuit, and outputs from the residual voltage generator circuit the analog voltage corresponding to the binary code value.

BRIEF DESCRIPTION OF THE DRAWINGS

The above and other objects, features and advantages of the present invention will become more apparent from the following detailed description made with reference to the accompanying drawings. In the drawings:

FIGS. 3A, 3B, and 3C are electric circuit diagrams illustrating switching states of each switch in an A/D conversion operation;

FIG. 4 is a time chart illustrating operation timing in the A/D conversion operation;

FIG. 5 is a table illustrating relation between 1.5-bit A/D conversion results and an output voltage;

FIG. 7 is a time chart illustrating operation timing in the D/A conversion operation;

FIG. 15 is a time chart illustrating operation timing in the D/A conversion operation in the second embodiment;

DETAILED DESCRIPTION OF THE PREFERRED EMBODIMENT (First Embodiment)

Figure 1:
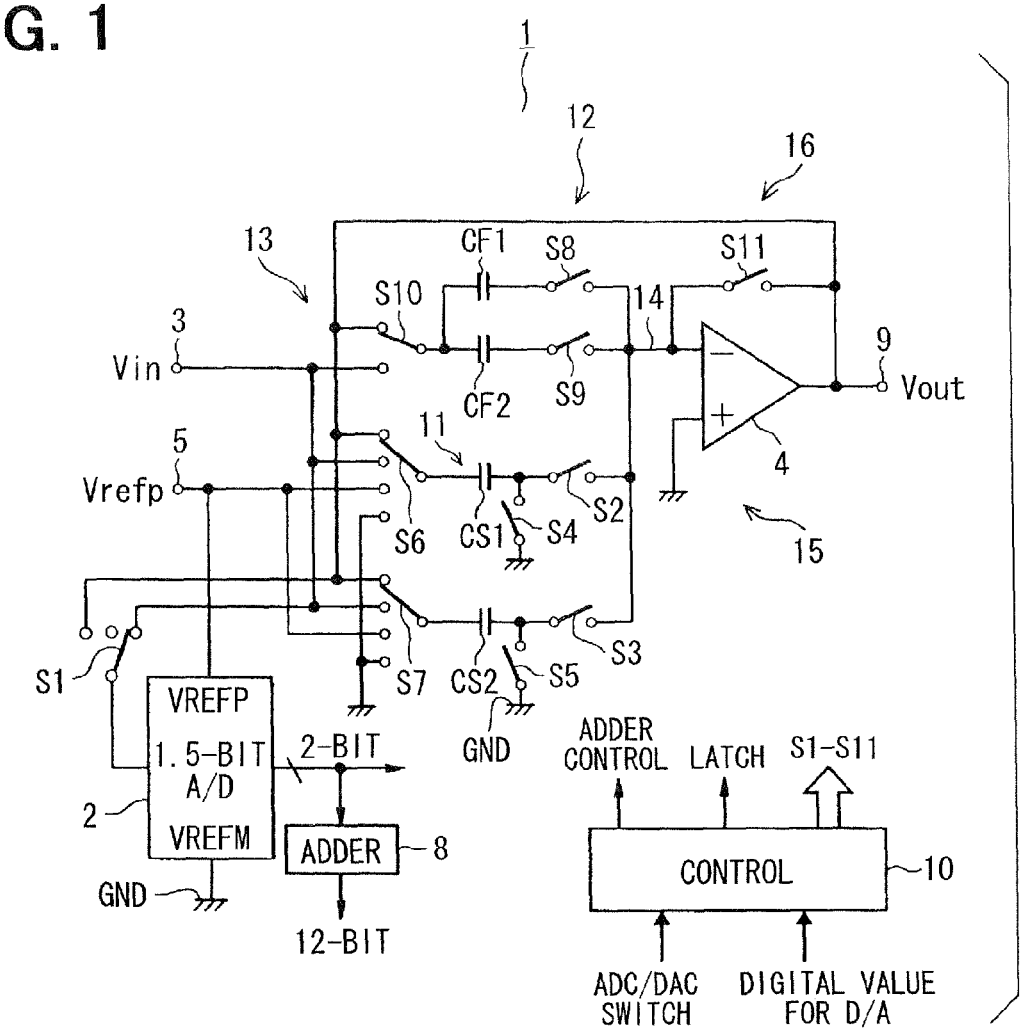
FIG. 1 is an electric circuit diagram illustrating of a cyclic A/D converter device according to a first embodiment of the present invention.

Referring to FIG. 1, a cyclic A/D converter device 1 is provided in a semiconductor integrated circuit device (IC) mounted, for example in an electronic control unit (ECU) for vehicle use. The cyclic A/D converter device 1 is configured to perform an A/D conversion operation and a D/A conversion operation. The cyclic A/D converter device 1 is manufactured with a CMOS process.

An input terminal of a parallel A/D converter circuit 2 with a resolution of 1.5 bits (m=1.5) is connected selectively, via a switch S1, to one of a signal input terminal 3 and an output terminal of an operational amplifier 4, or to a position of no connection. The signal input terminal 3 is supplied with an input signal voltage (external signal voltage) Vin as a target of A/D conversion. When an A/D conversion operation is performed, the input terminal of the A/D converter circuit 2 is selectively connected to one of the signal input terminal 3 and the output terminal of the operational amplifier 4, via the switch S1. When a D/A conversion operation is performed, the input terminal of the A/D converter circuit 2 is set as no connection (open).

Reference voltage input terminals VREFP and VREFM of the A/D converter circuit 2 are connected, respectively, to a reference voltage terminal (reference voltage line) 5, to which a reference voltage Vrefp is supplied, and to a ground terminal (reference voltage line) GND, to which a reference voltage Vrefm (0V) is supplied. Here, the reference voltage Vrefp is set to 5V, and the operational amplifier 4 operates by a single power supply of 5V.

Figure 2:
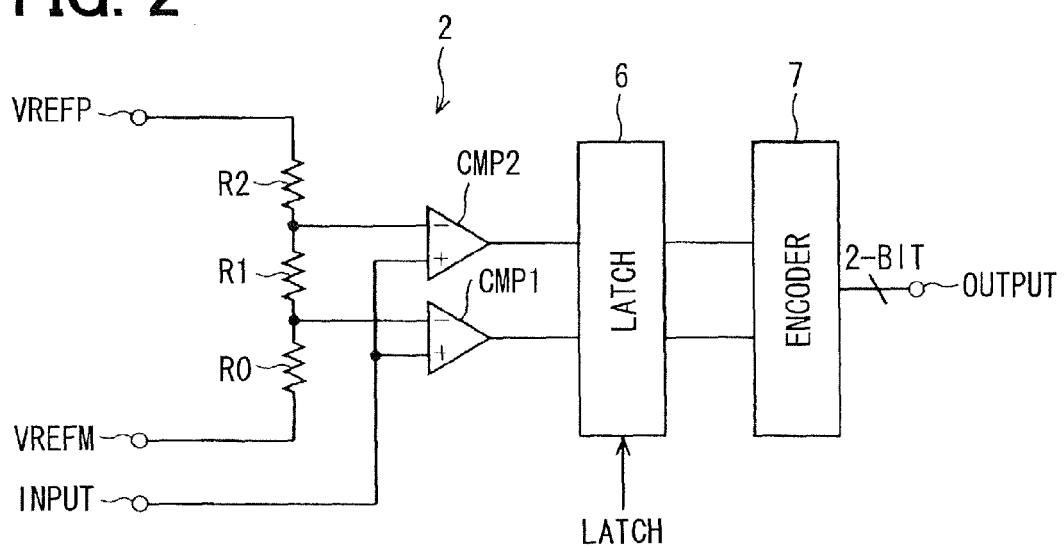
FIG. 2 is an electric circuit diagram of a 1.5-bit A/D converter circuit.
Figure 6A:
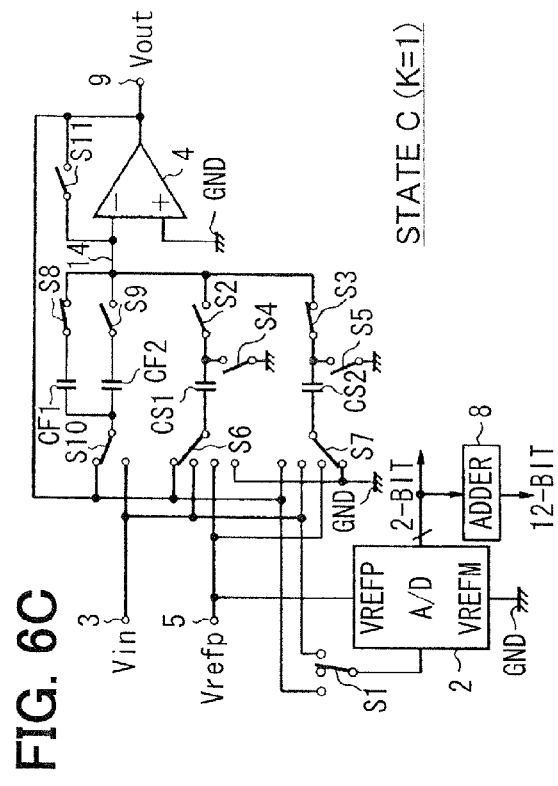
FIGS. 6A, 6B, 6C, and 6D are electric circuit diagrams illustrating switching states of each switch in a D/A conversion operation.
Figure 6C:
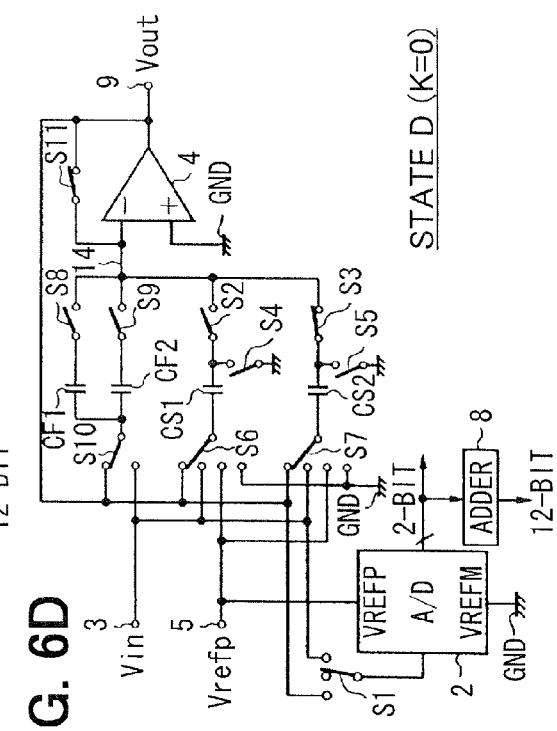
Figure 6B:
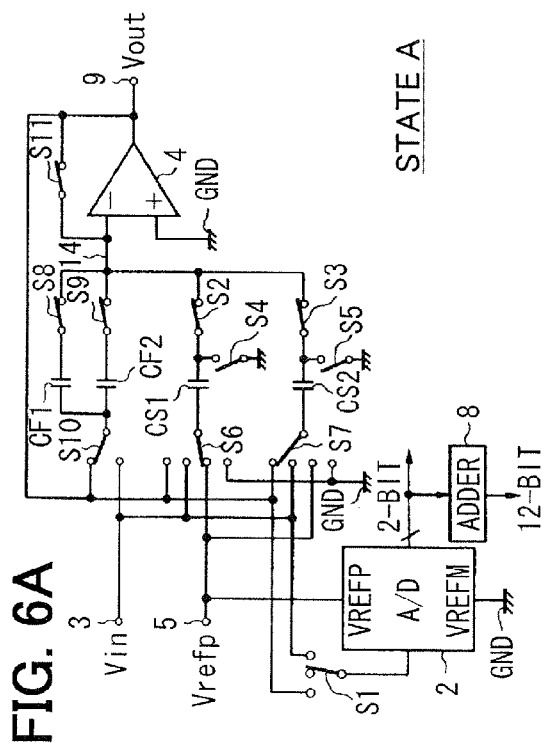
Figure 6D:
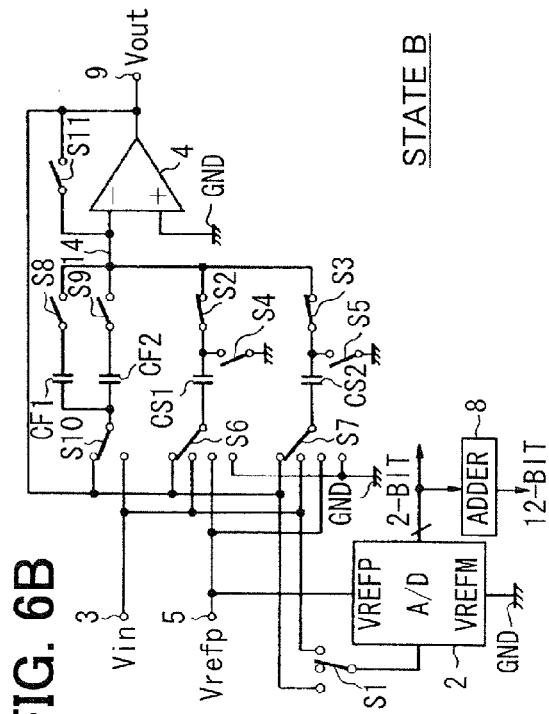

The A/D converter circuit 2 is configured electrically as illustrated in FIG. 2. That is, resistors R0 to R2 are connected in series between the reference voltage input terminals VREFM and VREFP of the A/D converter circuit 2. Common nodes of the resistors R0 and R1 and of the resistors R1 and R2 are connected to inverting input terminals (−) of comparators CMP1 and CMP2, respectively. Non-inverting input terminals (+) of the comparators CMP1 and CMP2 are connected to the input terminal of the A/D converter circuit 2. Here, the values of resistances of the resistors R0, R1, and R2 are set at a ratio of 3/8, 2/8, and 3/8, respectively. Reference voltages of 3/8·Vref (1.875V) and 5/8·Vref (3.125V) are inputted to the non-inverting input terminals of the comparators CMP1 and CMP2, respectively.

Output signals of a high level (H or "1") or a low level (L or "0") outputted from the comparators CMP1 and CMP2 are inputted into a latch circuit 6. When a latch signal is set to a high level, the latch circuit 6 holds the output signals of the comparators CMP1 and CMP2 at the time, and outputs the held output signals to an encoder 7. The encoder 7 generates and outputs one of A/D conversion codes "00", "01", and "10", based on the signal from the latch circuit 6. These A/D conversion codes correspond to "0", "1", and "2" in decimal, respectively. The A/D conversion codes are added together in an adder circuit 8 as illustrated in FIG. 1. The adder circuit 8 also includes a register for holding the added result.

In FIG. 1, lower electrodes (common-side electrodes) of capacitors CS1 and CS2 are connected to a common line 14 via switches S2 and S3 respectively, and also to the ground terminal GND via switches S4 and S5, respectively. The common line 14 is connected to an inverting input terminal (−) of the operational amplifier 4. Upper electrodes (non-common-side electrodes) of the capacitors CS1 and CS2 are selectively connected to one of the signal input terminal 3, the output terminal of the operational amplifier 4, the reference voltage terminal 5, and the ground terminal GND, via switches S6 and S7, respectively. Lower electrodes (common-side electrodes) of the capacitors CF1 and CF2 are connected to the common line 14 via switches S8 and S9, respectively. Upper electrodes (non-common-side electrodes) of the capacitors CF1 and CF2 are selectively connected to one of the signal input terminal 3 and the output terminal of the operational amplifier 4 via a switch S10.

A switch 511 is connected between the inverting input terminal and the output terminal of the operational amplifier 4. The output terminal of the operational amplifier 4 is connected to a signal output terminal 9. The signal output terminal 9 is for outputting an analog voltage after D/A conversion. The capacitors CS1, CS2, CF1, and CF2 have the same capacitances C with each other. The switches S1 to S11 are configured by analog switches.

The cyclic A/D converter device 1 is configured to selectively execute one of an A/D conversion operation and a D/A conversion operation, according to an ADC/DAC function switching signal supplied from the external side. The A/D conversion operation performs A/D conversion of an input signal voltage Vin inputted from the external side via the signal input terminal 3, and outputs an A/D conversion value of 12 bits (12-bit digital value). The D/A conversion operation performs D/A conversion of a digital value (binary code value) supplied from the external side and outputs the analog voltage Vout, via the signal output terminal 9. A control circuit 10 controls execution of the A/D conversion operation and the D/A conversion operation, each of which includes a plurality of steps. The control circuit 10 is supplied, from the external side, with the ADC/DAC function switching signal and a digital value as a target of D/A conversion. The control circuit 10 controls switching of the switches S1 to S11, outputs the latch signal, and controls the addition of the adder circuit 8 as well.

In the present embodiment, the capacitor CS1 corresponds to a first capacitor, the capacitor CS2 corresponds to a second capacitor, and the capacitors CF1 and CF2 correspond to a third capacitor. Although both of the capacitors CF1 and CF2 function as the third capacitor at the time of an A/D conversion operation, only the capacitor CF1 functions as the third capacitor at the time of a D/A conversion operation.

A capacitor array circuit 11 is configured by the capacitors CS1 and CS2. A residual voltage generator circuit 12 is configured by the operational amplifier 4, the capacitor array circuit 11, the capacitors CF1 and CF2, and switches S2 to S5, S8, S9, and S11. The residual voltage generator circuit 12 generates a residual voltage by amplifying a difference voltage of an inputted voltage and a predetermined analog voltage. An input switching circuit 13 is configured by the switches S1, S6, S7, and S10.

A charge divider circuit 15 is configured by the operational amplifier 4 and the capacitors CS1 and CS2. The charge divider circuit 15 stores a charge corresponding to the reference voltage Vrefp in the capacitor CS1 at first, divides the stored charge by a predetermined ratio (1/2) set up in advance, and stores the charge in the capacitors CS1 and CS2 again. A charge integration circuit 16 is configured by the operational amplifier 4 and the capacitors CS2 and CF1. The charge integration circuit 16 initializes a stored charge of the capacitor CF1 to zero at first, adds the stored charge and a stored charge of the capacitor CS2 of the charge divider circuit 15, and stores the result again.

Next, an A/D conversion operation, in which 1.5-bit A/D conversion is repeated 12 times (12 steps) by the A/D converter circuit 2 and an A/D conversion output value of 12 bits is produced, is described with reference to FIGS. 3A, 3B, 3C, and FIG. 4. FIGS. 3A, 3B, and 3C illustrate switching states of the switches S1 to S11. FIG. 4 illustrates operation timing of the cyclic A/D converter device 1. It is assumed that an ADC/DAC function switching signal, which instructs execution of an A/D conversion operation has already been supplied before the start of the A/D conversion operation, and that the switches S8 and S9 are set to an on-state (ON).

(1) From Time t0 to Time t1 (First Step)

When an A/D conversion start signal is inputted at time t0, the adder circuit 8 is cleared and the first step starts. In time t0 to t1, the A/D converter device 1 is switched to a state A illustrated in FIG. 3A by the following procedure. That is, the control circuit 10 turns the switch S1 to a position leading to the signal input terminal 3. The A/D converter circuit 2 starts the first A/D conversion (first step) by rendering the input signal voltage Vin as a conversion input voltage. In the A/D converter circuit 2, when the output signals of the comparators CMP1 and CMP2 are determined, the control circuit 10 outputs a latch signal and the conversion result is held in the latch circuit 6. Then, a 1.5-bit A/D conversion code outputted from the encoder 7 is added in the adder circuit 8. In the cyclic A/D converter device 1 including the 1.5-bit A/D converter circuit 2, it is necessary to perform a charge setup to capacitors which, form capacitance of as large as 4C in preparation for charge re-distribution. Therefore, in preparation for the charge re-distribution in the second step, the control circuit 10 turns on the switches S2, S3, and S11, and turns the switches S6, S7, and S10 to a position of sampling (position leading to the signal input terminal 3). In this case, the switches S4 and S5 are set to an off-state (OFF). Accordingly, the operational amplifier 4 operates as a voltage follower, and the output voltage (residual voltage) Vout(1) and the voltage of the inverting input terminal of the operational amplifier 4 are both set to 0V. Then, the capacitors CS1 and CS2 (value of capacitance of 2C) and the capacitors CF1 and CF2 (value of capacitance of 2C) are charged by the input signal voltage Vin, and a combined charge of 4C·Vin is set up.

(2) From Time t1 to Time t2 (Second Step)

In time t1 to t2, the A/D converter device 1 is switched to a state B illustrated in FIG. 3B by the following procedure. At time t1 after the first A/D conversion code is held, the control circuit 10 turns the switch S1 to a position leading to the signal output terminal 9 (output terminal of the operational amplifier 4) and turns off the switch S11. After the switch S11 is turned off completely, the control circuit 10 turns the switches S6 and S7 from the position of sampling to a position leading to the reference voltage terminal 5 or to a position leading to the ground terminal GND.

The present switching of the switches S6 and S7 is performed as illustrated in FIG. 5 based on an A/D conversion code. That is, when the input signal voltage Vin (output voltage Vout in the second and subsequent step) is less than 1.875V, the A/D conversion code (A/D conversion result outputted from the A/D converter circuit 2 becomes "00." When the A/D conversion code is "00," the switches S6 and S7 are both switched to the position leading to the ground terminal GND. Accordingly, the reference voltage Vrefm (0V) is applied to the upper electrodes of the capacitors CS1 and CS2.

When the input signal voltage Vin (output voltage Vout) is equal to or greater than 1.875V and less than 3.125V, the A/D conversion code outputted becomes "01." When the A/D conversion code is "01," one of the switches S6 and S7 is switched to the position leading to the reference voltage terminal 5 and the other switch is switched to the position leading to the ground terminal GND. Accordingly, the reference voltage Vrefp is applied to one of the upper electrodes of the capacitors CS1 and CS2, and the reference voltage Vrefm (0V) is applied to the other of the upper electrodes. When the input signal voltage Vin (output voltage Vout) is equal to or greater than 3.125V, the A/D conversion code outputted becomes "10." When the A/D conversion code is "10," both of the switches S6 and S7 are switched to the position leading to the reference voltage terminal 5. Accordingly, the reference voltage Vrefp is applied to the upper electrodes of the capacitors CS1 and CS2.

Before and after the switching-over of the switches S6 and S7, a charge of the inverting input terminal of the operational amplifier 4 is conserved. Therefore, after the switching, feedback control of the operational amplifier 4 is performed via the capacitors CF1 and CF2 so that voltage of the inverting input terminal is set to 0V. Consequently, charge re-distribution is performed between the capacitors CS1 and CS2 and the capacitors CF1 and CF2. Relational expression of charge conservation in the present case is given by Equation (1) as follows, assuming that the output voltage of the operational amplifier 4 is Vout(2), and that the first A/D conversion code is D(1) in decimal.

$$4C \cdot (0 - Vin) = D(1) \cdot C \cdot (0 - Vrefp) + 2C \cdot (0 - Vout(2)) \quad \text{(Eq. 1)}$$

From Equation (1), Equation (2) is derived as follows.

$$Vout(2) = 2 \cdot (Vin - D(1) \cdot Vrefp/4) \quad \text{(Eq. 2)}$$

Accordingly, in the second step, the output voltage (residual voltage) Vout(2), which is equal to the input signal voltage Vin subtracted by a D/A conversion voltage corresponding to the first A/D conversion code D(1) and multiplied by 2, is outputted at the output terminal of the operational amplifier 4.

An output voltage Vout(N) in the third and subsequent step is given by Equation (3) as follows, assuming that an output voltage in the previous step is Vout(N−1), and that an A/D conversion code in decimal in the previous step is D(N−1).

$$Vout(N) = 2 \cdot (Vout(N-1) - D(N-1) \cdot Vrefp/4) \quad \text{(Eq. 3)}$$

Relation between the A/D conversion code and the output voltage Vout(N) is illustrated in FIG. 5. That is, the output voltage Vout(N) for the A/D conversion code of "00" ("0" in decimal) is given by Equation (4) or Equation (5).

$$Vout(N) = 2 \cdot Vin \quad \text{(Eq. 4)}$$

$$\text{Vout}(N)=2\cdot\text{Vout}(N-1) \quad\quad\quad\quad (\text{Eq. 5})$$

The output voltage Vout(N) for the A/D conversion code of "01" ("1" in decimal) is given by Equation (6) or Equation (7).

$$\text{Vout}(N)=2\cdot\text{Vin}-\text{Vref}p/2 \quad\quad\quad\quad (\text{Eq. 6})$$

$$\text{Vout}(N)=2\cdot\text{Vout}(N-1)-\text{Vref}p/2 \quad\quad\quad\quad (\text{Eq. 7})$$

The output voltage Vout(N) for the A/D conversion code of "10" ("2" in decimal) is given by Equation (8) or Equation (9).

$$\text{Vout}(N)=2\cdot\text{Vin}-\text{Vref}p \quad\quad\quad\quad (\text{Eq. 8})$$

$$\text{Vout}(N)=2\cdot\text{Vout}(N-1)-\text{Vref}p/2 \quad\quad\quad\quad (\text{Eq. 9})$$

After the charge re-distribution is completed, and when the output voltage of the operational amplifier 4 is stabilized (for example, at the time when time set in advance has elapsed from time t1), the A/D converter circuit 2 starts the 1.5-bit A/D conversion for the second step. After the completion of the conversion, the second A/D conversion code is held in the latch circuit 6 synchronizing with the latch signal. The adder circuit 8 adds the second A/D conversion code to the first A/D conversion code, to overlap one bit.

(3) From Time t2 to Time t22 (from the Third Step to the Twelfth Step)

In time t2 to t3, the A/D converter device 1 is switched to a state C illustrated in FIG. 3C by the following procedure. That is, in the charge re-distribution in the third step, it is necessary to set a charge of 4C·Vout(2) to all the capacitors CS1, CS2, CF1, and CF2 in advance. Initialization of the capacitors CS1 and CS2 is not performed. At time t2 after the second A/D conversion code is held, the control circuit 10 turns off the switches S2 and S3 and holds the output voltage Vout(2) of the operational amplifier 4. During the hold operation, a charge C·Vout(2) is held in the capacitors CF1 and CF2, respectively. In this state, when the switches S4 and S5 are turned on and the switches S6 and S7 are switched to the position leading to the signal output terminal 9, the capacitors CS1 and CS2 are charged by the output voltage Vout(2) of the operational amplifier 4 (charge setup).

At time t3 after the charge setup of the capacitors CS1 and CS2 is completed, the control circuit 10 executes charge re-distribution in the same manner as in the second step. When the charge re-distribution is completed, the A/D converter circuit 2 starts the third 1.5-bit A/D conversion, and the third A/D conversion code is held after the completion of the conversion in the latch circuit 6, synchronizing with the latch signal. The adder circuits 8 adds the third A/D conversion code to the value, to which the first and second A/D conversion codes have been added, to overlap one bit.

An A/D conversion operation from the fourth step to the twelfth step at time t4 and later is the same as that of the A/D conversion operation in the third step described above. When the twelfth A/D conversion code is held in the latch circuit 6 synchronizing with the latch signal in the twelfth step, the adder circuit 8 adds the twelfth A/D conversion code to a value to which the first to the 11th A/D conversion codes have been added, to overlap one bit. Accordingly, the cyclic A/D converter device 1 obtains the final 12-bit A/D conversion code by truncating the least significant bit after the addition.

Next, a D/A conversion operation by the cyclic A/D converter device 1 is described with reference to FIGS. 6A, 6B, 6C, 6D, and 7. FIGS. 6A, 6B, 6C, and 6D illustrate switching states of the switches S1 to S11. FIG. 7 illustrates operation timing of the cyclic A/D converter device 1. The followings are assumed: that is, before a start of a D/A conversion operation, an ADC/DAC function switching signal which orders the execution of a D/A conversion operation has already been supplied, the switch S1 is set to the position of the no connection (open), the switch S10 is set to the position leading to the signal output terminal 9, and the switches S4 and S5 are set to OFF. The output of the A/D converter circuit 2 becomes undefined (not fixed) during the D/A conversion operation.

FIGS. 6A, 6B, 6C, and 6D illustrate respectively a sampling state A of the reference voltage Vrefp, a charge distribution state B between the capacitors CS1 and CS2, a charge addition state C from the capacitor CS2 to CF1 and a charge initialization state D of the capacitor CS2. An arrow illustrated in the figures indicates that transition between the states concerned may occur in the D/A conversion process.

FIG. 7 illustrates a time chart in a case where a D/A conversion is performed to a 3-bit digital value (binary code value) "111" and an analog output voltage Vout of 7/8·Vrefp is generated. First, the switches S2, S3, S8, S9, and S11 are set to ON, the switch S6 is switched to the position leading to the reference voltage terminal 5, and the switch S7 is switched to the position leading to the signal output terminal 9. In the present sampling state A, a charge C·Vrefp proportional to the reference voltage Vrefp is sampled to the capacitor CS1, and charges of the capacitors CS2, CF1, and CF2 are initialized to zero. The output voltage Vout at this time (1) is 0V.

Then, after the switches S8, S9, and S11 are turned off, the switch S6 is switched to the position leading to the signal output terminal 9, and the sampling state A shifts to the charge distribution state B. In the charge distribution state B, a charge of the capacitor CF1 is conserved. Since the capacitors CS1 and CS2 which have an same value of capacitance are connected between the output terminal and the inverting input terminal of the operational amplifier 4, the charge is equally distributed between the capacitors CS1 and CS2 (charge division operation by the charge divider circuit 15). A charge of the capacitors CS1 and CS2 is given by Equation (10) as follows, with the output voltage of Vout(2) in this case.

$$\text{Charge of CS1(CS2)}=C\cdot\text{Vout}(2)=(1/2)\cdot C\cdot\text{Vref}p \quad\quad\quad\quad (\text{Eq. 10})$$

After that, the digital value of a binary code value is processed bit-by-bit from a higher-order bit. When the bit K concerned is "0" (first logical level), the switch S2 is set to OFF and the switch S11 is set to ON, and the charge distribution state B as the starting point shifts to the charge initialization state D. In the present charge initialization state D, the charge of the capacitors CS1 and CF1 remains conserved, and the charge of the capacitor CS2 is initialized to zero. The output voltage Vout in this case is 0V.

On the other hand, when the bit K concerned is "1" (second logical level), the switch S2 is set to OFF, the switch S8 is set to ON, and the switch S7 is switched to the position leading to the ground terminal GND. The charge distribution state B as the starting point shifts to the charge addition state C. In the present charge addition state C, the charge of the capacitor CS1 remains conserved, and the charge distribution is performed between the capacitors CS2 and CF1. The charge of the capacitor CF1 becomes the sum of a charge which the capacitor CF1 has had by itself and the charge of the capacitor CS2 (charge adding operation by the charge integration circuit 16).

In the present case, since all three bits are "1", operation shifting from the charge distribution state B as the starting point to the charge addition state C is repeated three times, ending finally in the charge addition state C. The charge of the capacitor CF1 in the first shift is given by a charge 0 which the capacitor CF1 has had by itself plus a charge (=1/2·CVrefp) of the capacitor CS2, resulting in the sum (=1/2·CVrefp). In the second shift, the charge of the capacitor CF1 is given by the charge (=1/2·CVrefp) which the capacitor CF1 has had by itself plus a charge (=1/4·CVrefp) of the capacitor CS2, resulting in the sum (=3/4·CVrefp). In the third shift, the charge of the capacitor CF1 is given by the charge (=3/4·CVrefp) which the capacitor CF1 has had by itself plus a charge (=1/8·CVrefp) of the capacitor CS2, resulting in the sum (=7/8·CVrefp).

Generally, an analog voltage Vout produced by performing D/A conversion to a digital value (binary code value) "K1K2K3 ... Kn−1Kn" of "n" bits is given by Equation (11). In this case, when Ki is "1" and all of Ki+1, Ki+2, ..., Kn are "0", operation may be just terminated when the i-th shifting from the charge distribution state B as the starting point to the charge addition state C takes place.

$$Vout = \left( K1 \cdot \frac{1}{2} + K2 \cdot \left(\frac{1}{2}\right)^2 + K3 \cdot \left(\frac{1}{2}\right)^3 + \ldots + Kn \cdot \left(\frac{1}{2}\right)^n \right) \cdot vrefp \quad \text{(Eq. 11)}$$

Next, the following explains a case where the cyclic A/D converter device 1 with the configuration described above is applied to a sensor device, which performs predetermined signal processing to an output signal of a sensor and outputs the result.

Figure 8:
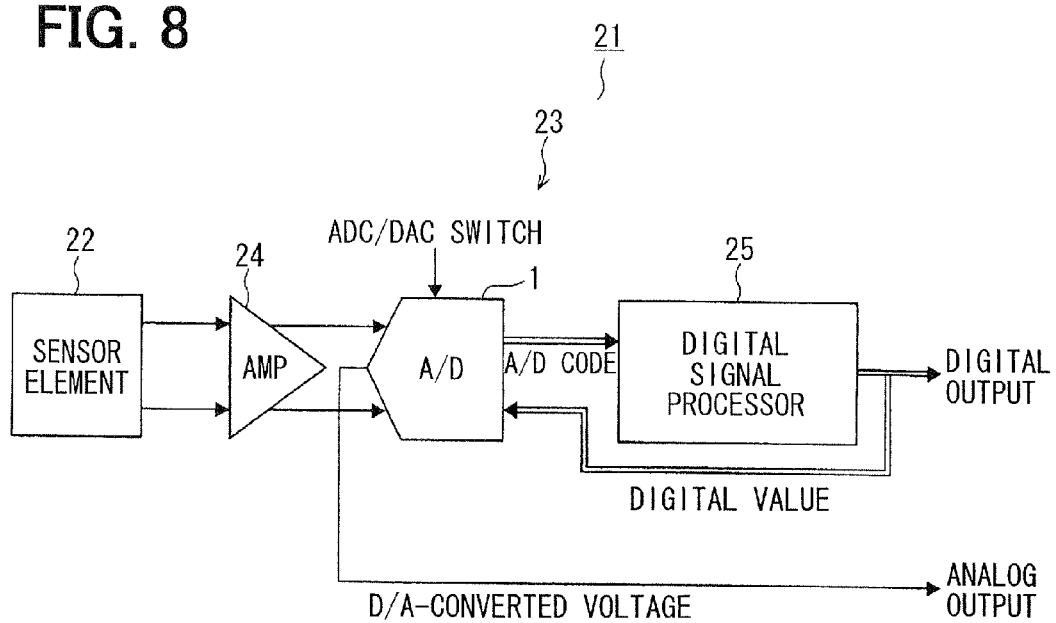
FIG. 8 is a block diagram illustrating outline structure of a sensor device which employs a cyclic A/D converter device.

Such a sensor device is configured as shown in FIG. 8. The sensor device is indicated by a reference numeral 21 and includes a sensor element 22 for a pressure sensor, for example, and a signal processing unit 23. The signal processing unit 23 includes an amplifier circuit 24, a cyclic A/D converter device 1, and a digital signal processor circuit (DSP) 25 (corresponding to a signal processor circuit).

The amplifier circuit 24 amplifies an analog signal (voltage) from the sensor element 22 by a predetermined gain, and outputs the amplified signal. An output voltage of the amplifier circuit 24 is supplied to the A/D converter device 1. When an ADC/DAC function switching signal ordering the execution of an A/D conversion operation is supplied, the A/D converter device 1 executes the A/D conversion operation to perform A/D conversion of the output voltage of the amplifier circuit 24. A digital conversion value (an A/D conversion value, a digital signal) outputted from the A/D converter device 1 is supplied to the digital signal processor circuit 25.

The digital signal processor circuit 25 performs a predetermined signal processing to the digital conversion value corresponding to the output voltage of the sensor element 22, outputted by the A/D converter device 1. For example, the digital signal processor circuit 25 executes a second order correction for improving the linearity of the output of the sensor element 22, an offset correction, etc. Although the signal processing can be changed as appropriate, what has a large merit especially by performing processing in a digital format is preferred as the signal processing. A digital signal after the correction outputted by the digital signal processor circuit 25 is outputted to the external side of the sensor device 21 and supplied to the A/D converter device 1 as well. When an ADC/DAC function switching signal ordering the execution of a D/A conversion operation is supplied, the A/D converter device 1 executes the D/A conversion operation to perform D/A conversion of the digital signal outputted by the digital signal processor circuit 25 and to output the analog voltage produced. The analog voltage outputted by the A/D converter device 1 is outputted to the external side of the sensor device 21.

By employing the A/D converter device 1 so that the A/D conversion operation may be always executed, the sensor device 21 with the above-described configuration functions as a sensor device of a digital output format, which executes a digital output operation to output a digital signal after giving the digital correction to an output of the sensor element 22. By employing the A/D converter device 1 so that the A/D conversion operation and the D/A conversion operation may be executed alternately by time sharing, the sensor device 21 functions as a sensor device with an analog output format which executes an analog output operation to output an analog voltage after giving the digital correction to an output of the sensor element 22.

The ADC/DAC function switching signal described above is outputted from a control circuit (not illustrated). That is, switching between the digital output format and the analog output format of the sensor device 21 is controlled by the control circuit. The output signal (digital value or analog voltage) of the sensor device 21 is supplied to the control circuit.

Figure 9:
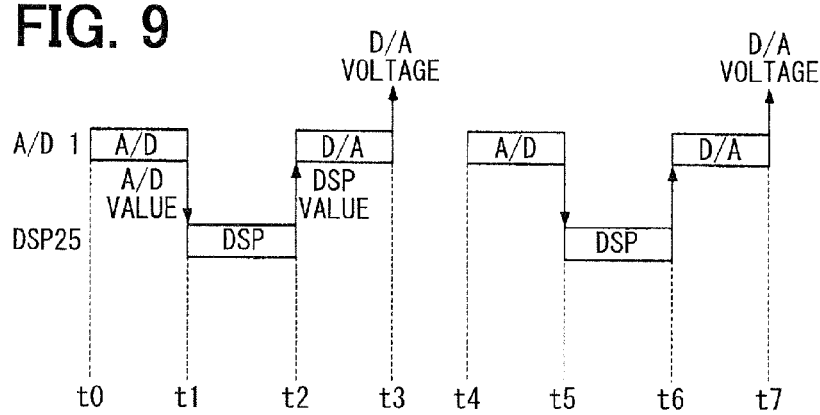
FIG. 9 is a time chart illustrating first operation timing of a sensor device with an analog output format.
Figure 10:
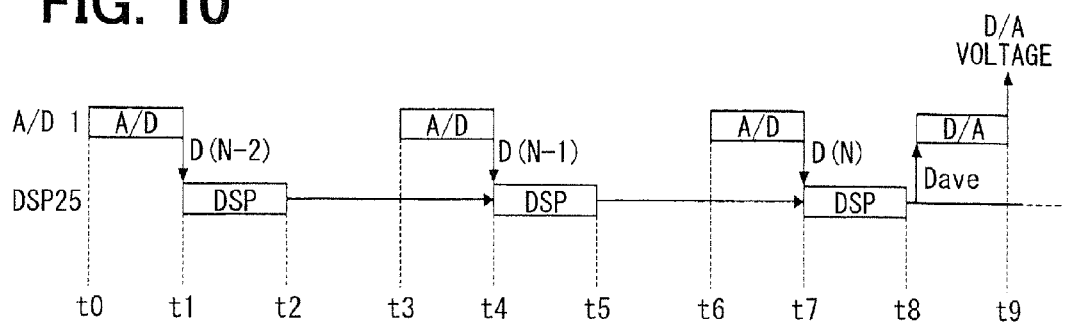
FIG. 10 is a time chart illustrating second operation timing of a sensor device with an analog output format.

The sensor device 21 functions as a device with an analog output format as described below with reference to FIGS. 9 and 10 which illustrate the operation timing of the A/D converter device 1 and the digital signal processor circuit 25.
(1) First Operation Pattern (FIG. 9)

First, the A/D converter device 1 is controlled to input an output voltage of the amplifier circuit 24 and to perform an A/D conversion operation (time t0 to t1). After that, the digital signal processor circuit 25 is controlled to perform the signal processing to the digital conversion value outputted from the A/D converter device 1 (time t1 to t2). Then, the A/D converter device 1 is controlled to input the output signal of the digital signal processor circuit 25 and to perform a D/A conversion operation (time t2 to t3). Here, an analog voltage outputted by the A/D converter device 1 is outputted to the external side. At time t3 and later, as is the case with time t0 to t3, the A/D conversion operation by the A/D converter device 1, the signal processing by the digital signal processor circuit 25, and the D/A conversion operation by the A/D converter device 1 are repeated in order.
(2) Second Operation Pattern (FIG. 10)

First, the A/D converter device 1 is controlled to input an output voltage of the amplifier circuit 24 and to perform an A/D conversion operation (time t0 to t1). After that, the digital signal processor circuit 25 is controlled to perform the signal processing to the digital conversion value outputted from the A/D converter device 1 (time t1 to t2). In time t3 to t5, as is the case with time t0 to t2, the A/D conversion operation by the A/D converter device 1 and the signal processing by the digital signal processor circuit 25 are executed. That is, the A/D conversion operation and the signal processing are alternately repeated three times in time t0 to t8.

After finishing the third signal processing, the digital signal processor circuit 25 calculates an average value (mean value) Dave of three times of the digital values, based on Equation (12) as follows. Here, it is assumed that a digital value produced in time t0 to t2 is D(N−2), a digital value produced in time t3 to t5 is D(N−1), and a digital value produced in time t6 to t8 is D(N).

$$\text{Dave} = (D(N) + D(N-1) + D(N-2))/3 \quad \text{(Eq. 12)}$$

The digital signal processor circuit 25 outputs to the A/D converter device 1 the average value Dave of three times of the digital values defined by Equation (12). Then, the A/D converter device 1 is controlled to input the average value Dave outputted by the digital signal processor circuit 25 and to perform a D/A conversion operation (time t8-t9). Here, an analog voltage outputted by the A/D converter device 1 is outputted to the external side. At time t9 and later, as is the case with time t0-t9, the following step is repeated, that is, the A/D conversion operation by the A/D converter device 1 and the signal processing by the digital signal processor circuit 25 are performed three times alternately and then the D/A conversion operation by the A/D converter device 1 is performed once.

The digital signal processor circuit 25 may be configured to calculate the average value of three times of digital values, based on Equation (12), whenever it performs the signal processing. In that case, what is necessary for the A/D converter device 1 is to perform a D/A conversion operation at the predetermined time and just to output an analog voltage to the external side. This predetermined time may be determined as a time when a predetermined order is supplied from an external control circuit. Alternatively, the predetermined time may be determined as a time when the average value Dave is calculated. That is, it is also preferable to output the calculated mean value Dave whenever it is calculated.

As described above, the first embodiment provides the following advantages.

The cyclic A/D converter device 1 is configured to selectively execute the A/D conversion operation and the D/A conversion operation by the operation of the control circuit 10, which controls switching of the switches S1 to S11 according to the ADC/DAC function switching signal supplied from the external side. The A/D conversion operation performs A/D conversion of the input signal voltage Vin inputted via the signal input terminal 3 from the external side and outputs the A/D conversion value of 12 bits. The D/A conversion operation outputs the analog voltage Vout produced by performing D/A conversion of the binary code value (digital value) supplied from the external side via the signal output terminal 9. That is, the cyclic A/D converter device 1 is configured to be able to perform a D/A conversion operation in addition to an A/D conversion operation, using the residual voltage generator circuit 12 which is provided primarily for performing the A/D conversion operation. Therefore, it is possible to realize a cyclic A/D converter device, which also has a D/A conversion function, without causing increase of a circuit scale. The cyclic A/D converter device 1 as described above can execute an A/D conversion operation and a D/A conversion operation of arbitrary resolutions easily, only by changing the number of times of cyclic operation. Therefore, even in a case where specification of the resolution is changed, it is possible to perform A/D conversion and D/A conversion with the required resolution, without changing the circuit configuration in response to the specification changed. When the A/D converter device 1 is fabricated as an integrated circuit (IC) chip, it is possible to reduce the size of the IC chip, because the circuit configuration can be reduced.

When the D/A conversion operation is performed, the charge divider circuit 15 divides the own stored charge, which has been set up according to the reference voltage in the beginning, by a ratio set up in advance, and stores the divided charge again. The charge integration circuit 16 adds the own stored charge, which has been initialized in the beginning, to the stored charge of the charge divider circuit, and stores the result again. Corresponding to each bit sequentially from the most significant bit (MSB) of the binary code supplied from the external side, the charge divider circuit 15 executes the division operation of a charge, and according to a data value of the bit concerned, the charge integration circuit 16 executes the add operation of a charge. Therefore, it is possible to perform a D/A conversion operation with a resolution corresponding to the number of bits of the binary code, without the need to increase the circuit configuration depending on the resolution.

By employing the A/D converter device 1 so that an A/D conversion operation may be always executed, the signal processing unit 23 of the sensor device 21 performs the A/D conversion of the analog signal outputted from the sensor element 22, then performs the predetermined digital signal processing, and outputs the digital signal as the result. Accordingly, it is possible to make the sensor device 21 function as a device with a digital output format. By employing the A/D converter device 1 so that the A/D conversion operation and the D/A conversion operation may be executed alternately by time sharing, the signal processing unit 23 performs the A/D conversion of the analog signal outputted from the sensor element 22, then performs a predetermined digital signal processing, and further performs D/A conversion to the digital signal as the result, and finally outputs the analog voltage produced. Accordingly, it is possible to make the sensor device 21 function as a device with an analog output format. When the sensor device 21 including the signal processing unit 23 of such a configuration is employed, it is possible to support both of the analog output format and the digital output format. According to the configuration described above, it is possible to attain reduction in size of the sensor device, compared with a sensor device which is designed to support a digital output format and an analog output format by mounting both a cyclic-type A/D converter device and a cyclic-type D/A converter.

(Second Embodiment)

A second embodiment of the present invention is described next with reference to FIG. 11 to FIG. 15, in which the same sign is attached to the same member of the first embodiment.

Figure 11:
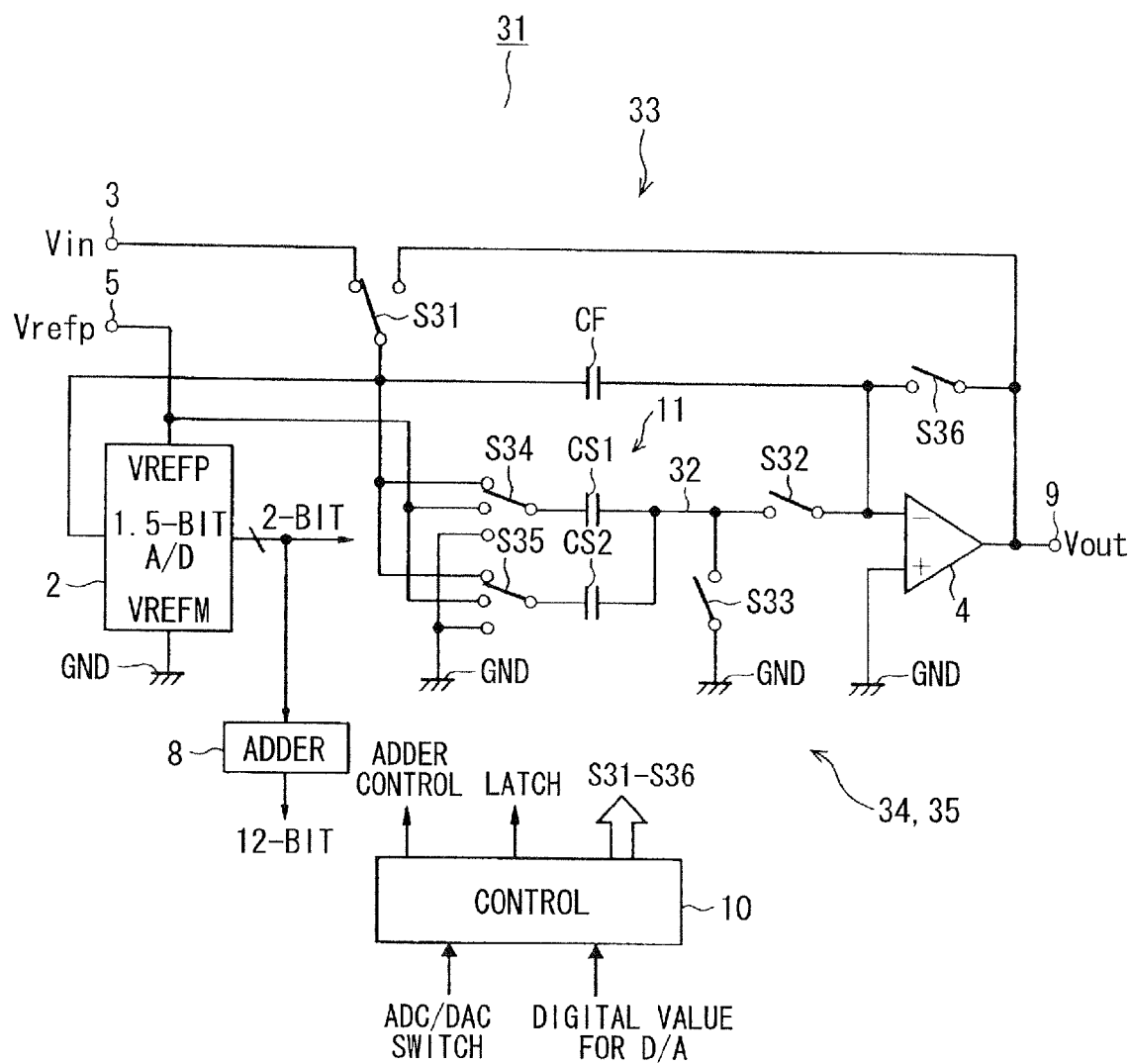
FIG. 11 is an electric circuit diagram illustrating a cyclic A/D converter device according to a second embodiment of the present invention.

Referring to FIG. 11, a cyclic A/D converter device 31 is provided to perform an A/D conversion operation and a D/A conversion operation, as is the case with the cyclic A/D converter device 1 illustrated in FIG. 1. An input terminal of an A/D converter circuit 2 is selectively connected to one of a signal input terminal 3 and an output terminal of an operational amplifier 4 via a switch S31. Each of lower electrodes (common-side electrode) of capacitors CS1 and CS2 is connected to a common line 32. The common line 32 is connected to an inverting input terminal of the operational amplifier 4 via a switch S32, and connected to a ground terminal GND via a switch S33. Upper electrodes (non-common-side electrodes) of the capacitors CS1 and CS2 are selectively connected to one of a common contact of the switch S31, a reference voltage terminal 5, and the ground terminal GND, via switches S34 and S35, respectively.

A switch S36 is connected between the inverting input terminal and the output terminal of the operational amplifier 4. A capacitor CF is connected between the switch S31 and the inverting input terminal of the operational amplifier 4. A non-inverting input terminal of the operational amplifier 4 is connected to the ground terminal GND. The capacitor CF possesses twice as much capacitance (2C) of the capacitance (C) of each of the capacitor CS1 and the capacitor CS2. The capacitor CF is connected between the input terminal and the output terminal of the operational amplifier 4, in the state where the switch S36 is switched to OFF and the switch S31 is switched to the position leading to the output terminal of the operational amplifier 4. Switching of the switches S31 to S36 is controlled by a control circuit 10.

In the second embodiment, the capacitor CF corresponds to the third capacitor, and the switch S31 corresponds to the input switching circuit. A residual voltage generator circuit 33 is configured by the operational amplifier 4, the capacitor array circuit 11, the capacitor CF, and the switches S32 to S36. A charge integrator circuit 34 and a charge divider circuit 35 are configured by the operational amplifier 4 and the capacitors CS1, CS2, and CF. The charge integrator circuit 34 and the charge divider circuit 35 are closely related with each other in operation. The charge integrator circuit 34 initializes a stored charge of the capacitor CF first, then adds cumulatively to the stored charge of the capacitor CF a charge corresponding to a bit data value of a binary code or a charge corresponding to a predetermined reference voltage Vrefm (0V). The charge divider circuit 35 divides the stored charge of the capacitor CF by a ratio (1/2) set up in advance, and stores the divided charge again.

Figure 12A:
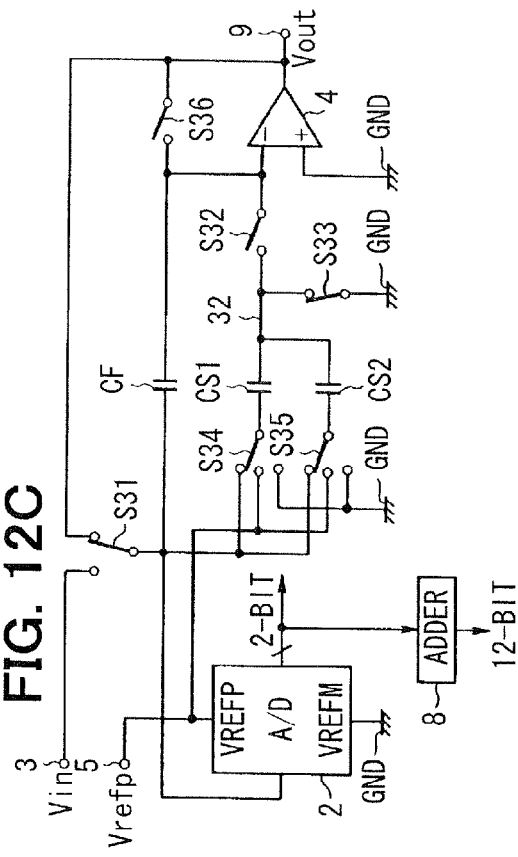
FIGS. 12A, 12B, and 12C are electric circuit diagrams illustrating switching states of each switch in an A/D conversion operation in the second embodiment.
Figure 12B:
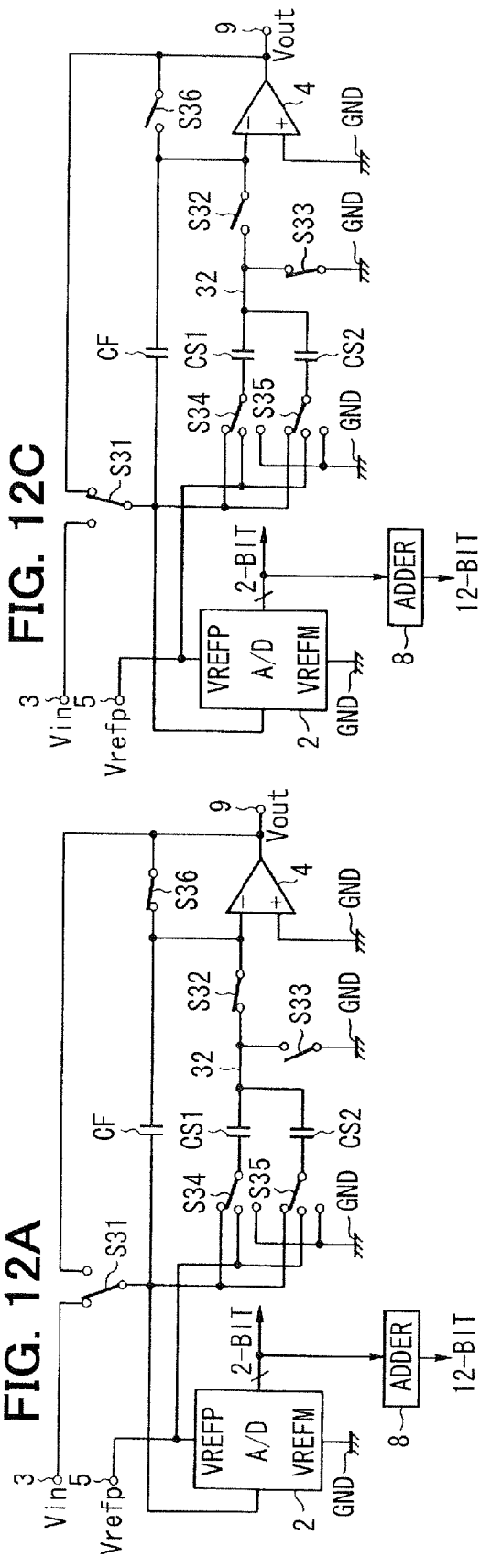
Figure 12C:
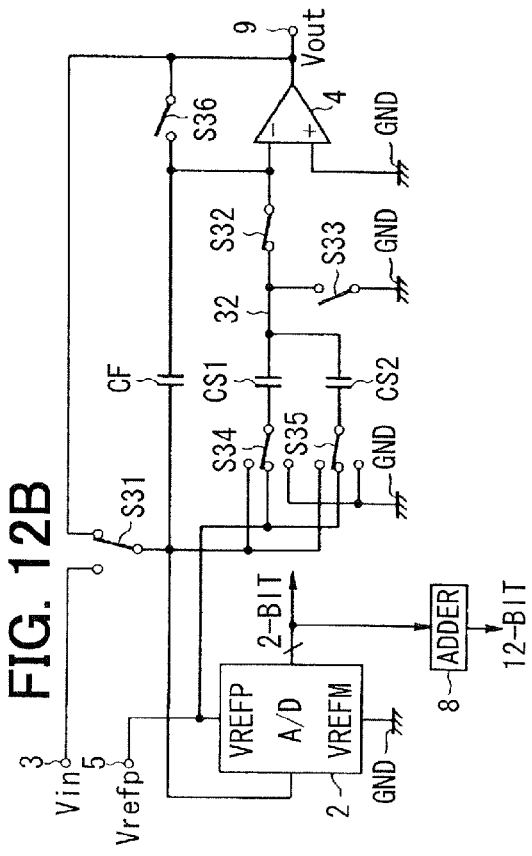
Figure 13:
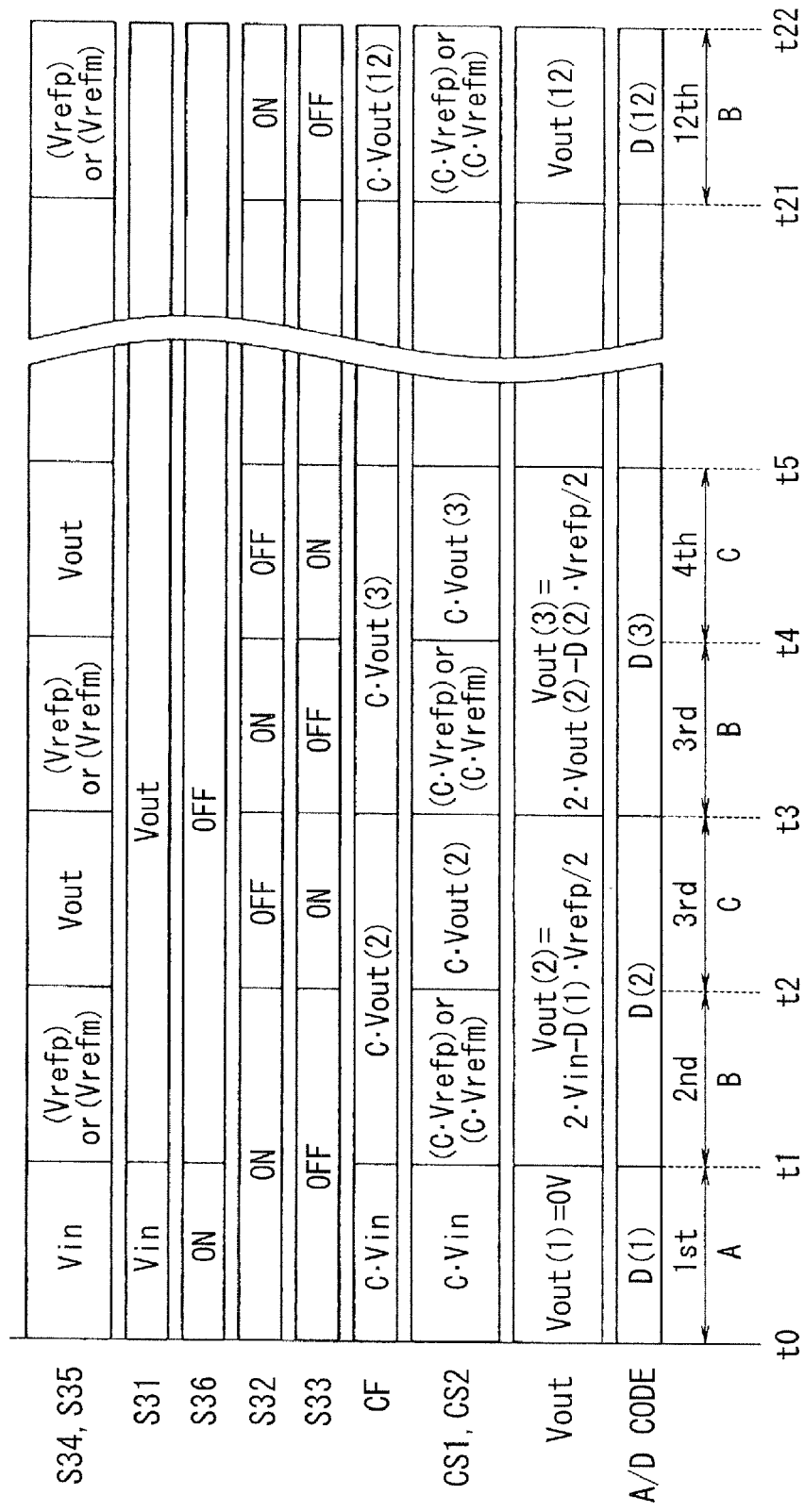
FIG. 13 is a time chart illustrating operation timing in the A/D conversion operation in the second embodiment.
Figure 14A:
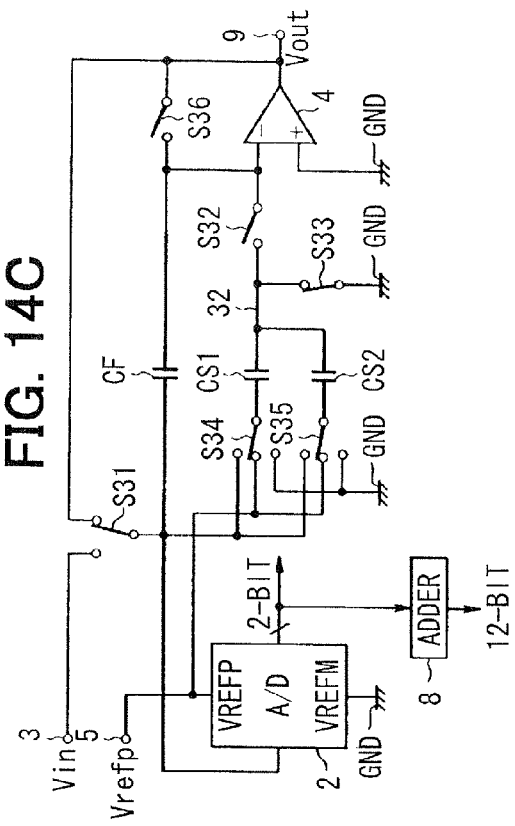
FIGS. 14A, 14B, 14C, and 14D are electric circuit diagrams illustrating switching states of each switch in a D/A conversion operation in the second embodiment.
Figure 14C:
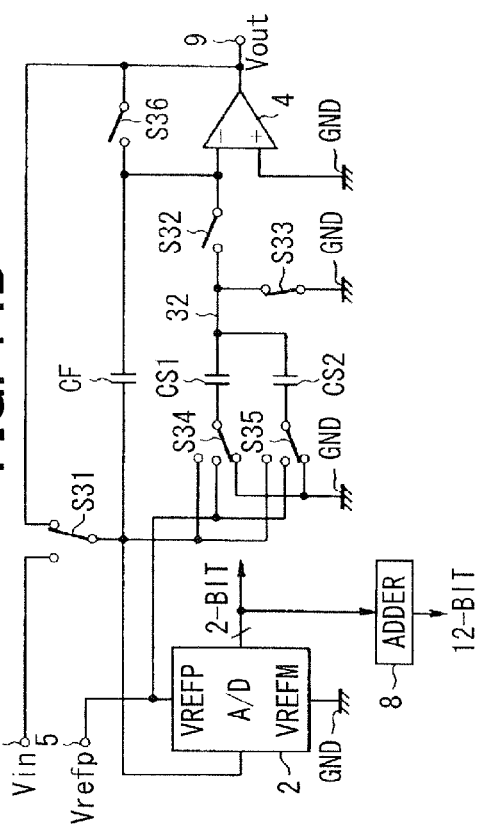
Figure 14B:
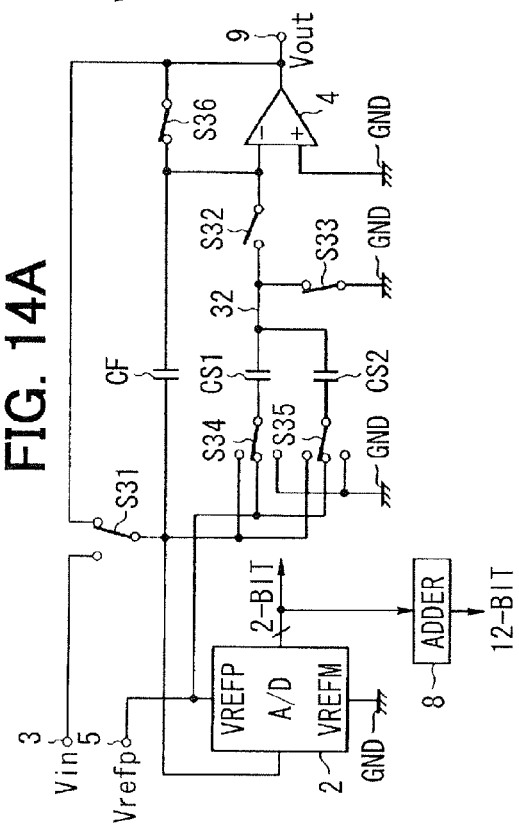
Figure 14D:
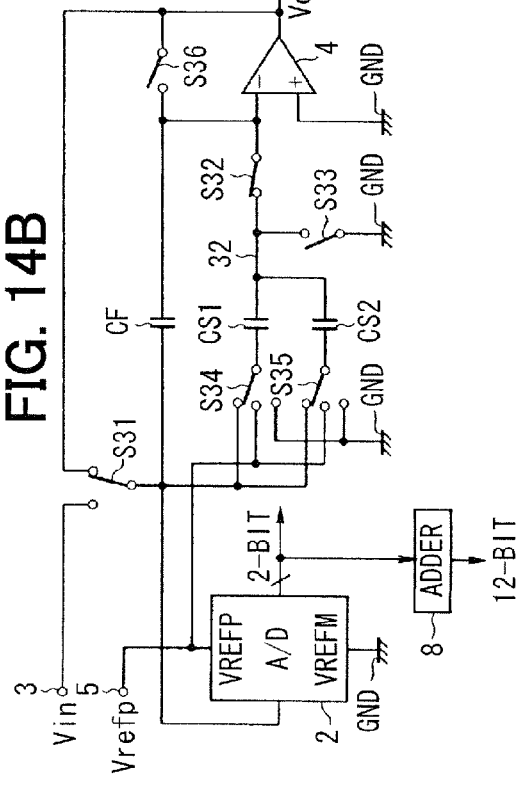

Next, an A/D conversion operation for producing an A/D conversion output value of 12 bits will be described with reference to FIGS. 12A, 12B, 12C, and FIG. 13. FIGS. 12A, 12B, and 12C illustrate switching states of the switches S31 to S36. FIG. 13 illustrates operation timing of the cyclic A/D converter device 31. It is assumed that, before a start of an A/D conversion operation, an ADC/DAC function switching signal which instructs the execution of an A/D conversion operation has already been supplied.

(1) From Time t0 to Time t1 (First Step)

When an A/D conversion start signal is inputted at time t0, the adder circuit 8 is cleared and the first step starts. In time t0 to t1, the A/D converter device 31 is switched to a state A illustrated in FIG. 12A by the following procedure. That is, the control circuit 10 turns the switch S31 to the position leading to the signal input terminal 3, and the A/D converter circuit 2 starts the first A/D conversion. An A/D conversion code as the conversion result is added in the adder circuit 8.

In the cyclic A/D converter device 31, it is necessary to perform a charge setup to capacitors, which form capacitance of as large as 4C in preparation for charge re-distribution. Therefore, in preparation for the charge re-distribution in the second step, the control circuit 10 turns on the switches S32 and S36, and turns the switches S34 and S35 to the position of sampling (position leading to the switch S31). In this case, the switch S33 is set to OFF. Accordingly, the operational amplifier 4 operates as a voltage follower, and the output voltage and the voltage of the common line 32 are both set to 0V. Then, the capacitors CS1 and CS2 (value of capacitance=2C) and the capacitor CF (value of capacitance=2C) are charged by the input signal voltage Vin, and a combined charge of 4C·Vin is set up.

(2) From Time t1 to Time t2 (Second Step)

In time t1 to t2, the A/D converter device 1 is switched to a state B illustrated in FIG. 12B by the following procedure. At time t1 after the first A/D conversion code is held, the control circuit 10 turns the switch S31 to the position leading to the signal output terminal 9 and turns off the switch S36. After the switch S36 is turned off completely, the control circuit 10 turns the switches S34 and S35 from the position of sampling to the position leading to the reference voltage terminal 5 or to the position leading to the ground terminal GND, to execute the charge re-distribution. Relational expression of the charge conservation in the present case is given by Equation (1) and Equation (2) as described above.

When the charge re-distribution has completed and the output voltage of the operational amplifier 4 illustrated by Equation (2) is stabilized, the A/D converter circuit 2 starts the second 1.5-bit A/D conversion, and after the completion of the conversion, the second A/D conversion code is held in the latch circuit 6 synchronizing with a latch signal. The adder circuit 8 adds the second A/D conversion code to the first A/D conversion code, to overlap one bit.

(3) From Time t2 to Time t22 (from the Third Step to the Twelfth Step)

In time t2 to t3, the A/D converter device 31 is switched to a state C illustrated in FIG. 12C by the following procedure.

That is, in the charge re-distribution in the third step, it is necessary to set a charge of 4C·Vout(2) to all the capacitors CS1, CS2, and CF in advance. Initialization of the capacitors CS1 and CS2 is not performed. At time t2 after the second A/D conversion code has been held, the control circuit 10 turns off the switch S32, and holds the output voltage Vout(2) of the operational amplifier 4. During the hold operation, a charge 2C·Vout(2) is held in the capacitor CF. When turning on the switch S33 and switching the switches S34 and S35 to the position of sampling in the present state, the array capacitors CS1 and CS2 are charged by the output voltage Vout(2) of the operational amplifier 4 (charge setup).

At time t3 after the charge setup of the capacitors CS1 and CS2 is completed, the control circuit 10 executes the charge re-distribution, as is the case with the second step. When the charge re-distribution is completed, the A/D converter circuit 2 starts the third 1.5-bit A/D conversion, and the third A/D conversion code is held after the completion of the conversion in the latch circuit 6, synchronizing with the latch signal. The adder circuits 8 adds the third A/D conversion code to the value to which the first and second A/D conversion codes have been added, to overlap one bit.

An A/D conversion operation from the fourth step to the twelfth step after time t4 is the same as that of the A/D conversion operation in the third step described above. When the twelfth A/D conversion code is held in the latch circuit 6 synchronizing with the latch signal in the twelfth step, the adder circuit 8 adds the twelfth A/D conversion code to a value to which the first to the eleventh A/D conversion codes have been added, to overlap one bit. Accordingly, the cyclic A/D converter device 1 produces the final 12-bit A/D conversion code by truncating the least significant bit after the addition.

Next, a D/A conversion operation by the cyclic A/D converter device 31 is described with reference to FIGS. 14A, 14B, 14C, 14D and FIG. 15. FIGS. 14A, 14B, 14C, and 14D illustrate switching states of the switches S31 to S36. FIG. 15 illustrates operation timing of the cyclic A/D converter device 31. It is assumed that an ADC/DAC function switching signal which instructs execution of a D/A conversion operation has already been supplied before the start of the D/A conversion operation, and that the switch S31 is set to the position leading to the signal output terminal 9. The output of the A/D converter circuit 2 becomes undefined during the D/A conversion operation.

Compared with the cyclic A/D converter device 1 illustrated in FIG. 1, which performs processing in order from the MSB to the LSB of a binary code, the cyclic A/D converter device 31 of the second embodiment performs processing in order from the LSB to the MSB of a binary code, executing the integration operation of a charge by the charge integrator circuit 34 and the division operation of a charge by the charge divider circuit 35, corresponding to each bit data value. In this respect, the cyclic A/D converter device 31 of the second embodiment differs from the cyclic A/D converter device 1 illustrated in FIG. 1.

FIGS. 14A, 14B, 14C, and 14D illustrate, respectively, a sampling state A which doubles as initialization of the capacitor CF, a charge distribution state B between the capacitor CF and the capacitors CS1 and CS2 (charge integration operation, charge division operation), a sampling state C of the reference voltage Vrefp to the capacitors CS1 and CS2, and a sampling state D of the reference voltage Vrefm (0V) to the capacitors CS1 and CS2. An arrow illustrated in the figures indicates that transition between the states concerned may occur in the D/A conversion process.

FIG. 15 illustrates a time chart of the A/D converter device 31, when a digital value "K1K2K3" as a binary code value is "101." In the first sampling state A, since a data value of the LSB expressed in the binary code "K1K2K3"="101" is "1", the switches S33 and S36 are set to ON, the switch S32 is set to OFF, and the switches S34 and S35 are switched to the position leading to the reference voltage terminal 5. Accordingly, a charge C·Vrefp corresponding to the reference voltage Vrefp is sampled to the capacitors CS1 and CS2. This sampling state A doubles as initialization of a charge of the capacitor CF, and the charge of the capacitor CF becomes zero.

Then, after the switches S33 and S36 are turned off, the switch S32 are turned on, and the switches S34 and S35 are switched to the position leading to the signal output terminal 9, and the sampling state A shifts to the charge distribution state B. The capacitor CF and the capacitors CS1 and CS2, which have the same value of capacitance are connected between the output terminal and the inverting input terminal of the operational amplifier 4. The value of capacitance of the capacitor CF is 2C, and the value of capacitance of the capacitors CS1 and CS2 is C, respectively. Addition of a charge and division of a charge are performed at the same time between the capacitor CF and the capacitors CS1 and CS2. As a result, the charge of the capacitor CF becomes as 2·CVout(2), and the charge of the capacitors CS1 and CS2 becomes respectively as C·Vout(2).

Since the next bit K2 is "0", the switch S32 is turned off, the switch S33 is turned on, the switches S34 and S35 are switched to the position leading to the ground terminal GND, and the state shifts to the sampling state D. Accordingly, a charge zero corresponding to the reference voltage Vrefm (0V) is sampled to the capacitors CS1 and CS2. After that, the state shifts to the charge distribution state B, and addition of a charge and division of a charge are performed at the same time between the capacitor CF and the capacitors CS1 and CS. As a result, the charge of the capacitor CF is given by Equation (13), and the charge of the capacitors CS1 and CS2 is given by Equation (14), with the output voltage of Vout(3) in this case.

Charge of CF=2C·Vout(3)=(1/2)·C·Vrefp  (Eq. 13)

Charge of CS1(CS2)=C·Vout(3)=(1/4)·C·Vrefp  (Eq. 14)

Since the next bit K1 (MSB) is "1", the switch S32 is turned off, the switch S33 is turned on, and the switches S34 and S35 are switched to the position leading to the reference voltage terminal 5, and the state shifts to the sampling state C. Accordingly, a charge C·Vrefp corresponding to the reference voltage Vrefp is sampled by the capacitors CS1 and CS2. After that, the state shifts to the charge distribution state B, and addition of a charge and division of a charge are performed at the same time between the capacitor CF and the capacitors CS1 and CS2. As a result, the charge of the capacitor CF is given by Equation (15), and a charge of capacitors CS1 and CS2 is given by Equation (16), with the output voltage of Vout(4) in this case.

Charge of CF=2·C·Vout(4)=(5/4)·C·Vrefp  (Eq. 15)

Charge of CS1(CS2)=C·Vout(4)=(5/8)·C·Vrefp  (Eq. 16)

Assuming that a binary code K is expressed by "K1K2K3, . . . , Kn−1Kn", as expressed by Equation (17), the output voltage Vout(n) corresponding to the initialization of the capacitor CF is set to "0" as expressed by Equation (18), and the output voltage Vout(n−1) produced by addition and division of the first charge corresponding to the LSB is given by (Vout(n)+Kn·Vrefp)/2. The control circuit 10 performs cyclic execution of the addition of charges of the capacitor CF and the capacitors CS1 and CS2 and the division (1/2) of charges of the capacitor CF and the capacitors CS1 and CS2, corresponding to each bit in order from the LSB to the MSB. The output voltage Vout(0) produced by addition and division of the last charge corresponding to the MSB is given by (Vout(1)+Kn·Vrefp)/2. This is the final output voltage Vout. Consequently, according to the binary code K, the output voltage Vout of an analog format given by Equation (19) can be produced.

$$K = \sum_{i=1}^{n} 2^{n-i} \cdot Ki \quad \text{(Eq. 17)}$$

K: Digital value code $$Vout(i-1) = \frac{1}{2}\{Vout(i) + ki \cdot Vrefp\} \quad \text{(Eq. 18)}$$

$(i = n, n-1, n-2, \ldots, 1)$
$Vout(n) = 0$
$Vout = Vout(0)$ $$Vout = \left\{K1\left(\frac{1}{2}\right) + K2\left(\frac{1}{2}\right)^2 + K3\left(\frac{1}{2}\right)^3 + \ldots + Kn\left(\frac{1}{2}\right)^n\right\} \cdot Vrefp \quad \text{(Eq. 19)}$$

As described above, the following advantages are produced according to the present embodiment.

The cyclic A/D converter device 31 is configured to selectively execute the A/D conversion operation and the D/A conversion operation, by the operation of the control circuit 10 controlling switching of the switches S31 to S36 according to an ADC/DAC function switching signal supplied from the external side. Here, the A/D conversion operation performs A/D conversion of the input signal voltage Vin inputted via the signal input terminal 3 from the external side and outputs the A/D conversion value of 12 bits, and the D/A conversion operation outputs the analog voltage Vout produced by performing D/A conversion of the binary code value (digital value) supplied from the external side via the signal output terminal 9. That is, as is the case with the cyclic A/D converter device 1 of the first embodiment, the cyclic A/D converter device 31 is configured to be able to perform a D/A conversion operation in addition to an A/D conversion operation, using the residual voltage generator circuit 33 which is provided primarily for performing the A/D conversion operation. Therefore, the same advantage as in the first embodiment is produced by the present embodiment.

When the D/A conversion operation is performed, the charge integrator circuit 34 initializes a stored charge, then adds cumulatively to the stored charge a charge corresponding to a bit data value of a binary code or a charge corresponding to the reference voltage Vrefm (0V), and the charge divider circuit 35 divides the stored charge of the charge integrator circuit 34 by a ratio (1/2) set up in advance and stores the divided charge again. Corresponding to each bit in order from the LSB of the binary code, the integration operation of a charge by the charge integrator circuit 34 and the division operation of a charge by the charge divider circuit 35 are executed. Therefore, according to the second embodiment, it is possible to perform a D/A conversion operation with a resolution corresponding to the number of bits of the binary code, without increasing the circuit configuration depending on the resolution.

(Third Embodiment)

A third embodiment of the present invention is described next with reference to FIG. 16, in which the same sign is attached to the same member of the foregoing embodiments.

Figure 16:
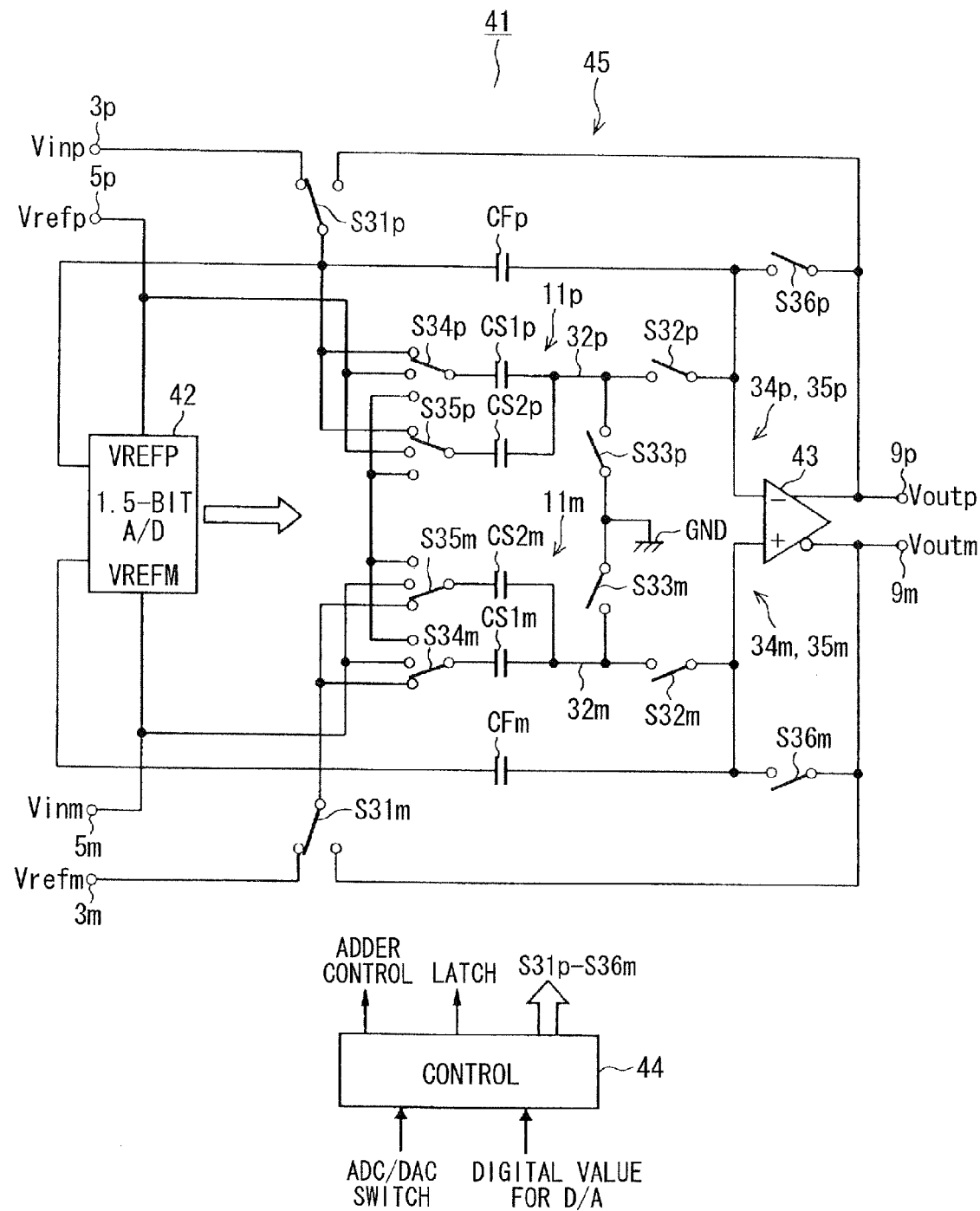
FIG. 16 is an electric circuit diagram illustrating of a cyclic A/D converter device according to a third embodiment of the present invention.

Referring to FIG. 16, a cyclic A/D converter device 41 is configured to perform a differential operation. The cyclic A/D converter device 41 is a differential configuration of the cyclic A/D converter device 31 illustrated in FIG. 11. A parallel-connected A/D converter circuit 42 with a resolution of 1.5 bits is configured to perform a differential operation, and an operational amplifier 43 is configured to supply a differential output. A non-inverting input terminal of the A/D converter circuit 42 is selectively connected to one of a non-inverted signal input terminal 3p and a non-inverted output terminal of the operational amplifier 43 via a switch S31p. Similarly, an inverting input terminal of the A/D converter circuit 42 is selectively connected to one of an inverted signal input terminal 3m and an inverted output terminal of the operational amplifier 43 via a switch S31m.

As is the case with the single configuration illustrated in FIG. 11, a capacitor CFp, capacitors CS1p and CS2p which configure a capacitor array circuit 11p, switches S34p and S35p which switch the connecting of upper electrodes of the capacitors CS1p and CS2p, and a switch S32p are connected between a common contact of the switch S31p and an inverting input terminal of the operational amplifier 43. A switch S33p is connected between a common line 32p and a ground terminal GND, and a switch S36p is connected between the inverting input terminal and the non-inverted output terminal of the operational amplifier 43.

Similarly, a capacitor CFm, capacitors CS1m and CS2m which configure a capacitor array circuit 11m, switches S34m and S35m which switch the connecting of upper electrodes of the capacitors CS1m and CS2m, and a switch S32m are connected between a common contact of the switch S31m and the non-inverting input terminal of the operational amplifier 43. A switch S33m is connected between a common line 32m and the ground terminal GND, and a switch S36m is connected between the non-inverting input terminal and the inverted output terminal of the operational amplifier 43.

In the second embodiment, a residual voltage generator circuit 45 is configured by the operational amplifier 43, the capacitor array circuits 11p and 11m, the capacitors CFp and CFm, and the switches S32p, S32m to S36p, S36m. A charge integrator circuit 34p and a charge divider circuit 35p are configured by the operational amplifier 43 and the capacitors CS1p, CS2p, and CFp. A charge integrator circuit 34m and a charge divider circuit 35m are configured by the operational amplifier 43 and the capacitors CS1m, CS2m, and CFm.

A control circuit 44 controls the A/D conversion operation and the D/A conversion operation, each of which includes plural steps. The control circuit 44 is supplied, from the external side, with an ADC/DAC function switching signal and a digital value (binary code value) as a target of D/A conversion. The control circuit 44 controls switching of the switches S31p, 31m to S36p, S36m, outputs a latch signal, and controls an addition operation of an adder circuit (not illustrated). It is preferable to configure the layout of the present circuit as a symmetrical structure with respect to the non-inverting signal side and the inverting signal side.

When an A/D conversion code outputted from the non-inverted output terminal of the A/D converter circuit 42 is n (decimal notation), an A/D conversion code of (2−n) is outputted from the inverted output terminal. The A/D conversion code n is added in an adder circuit (not illustrated) by the method described above. Voltages which deviate respectively to the plus side and the minus side by the same voltage value centering on a suitable voltage, for example, (Vrefp+Vrefm)/2, is outputted at the non-inverted output terminal and the inverted output terminal of the operational amplifier 43 of the differential input-output type.

A switching state and operation timing of each switch when an A/D conversion operation is performed by the cyclic A/D converter device 41 which is configured as described above are generally the same as the switching states illustrated in FIGS. 12A, 12B, and 12C and the operation timing illustrated in FIG. 13, respectively. However, at the time of the charge re-distribution, the switches S34p and S35p are switched based on the A/D conversion code n outputted from the non-inverted output terminal of the A/D converter circuit 42, and the switches S34m and S35m are switched based on the A/D conversion code (2−n) outputted from the inverted output terminal of the A/D converter circuit 42. For example, when the A/D conversion code n is "1", one of the switches S34p and S35p is switched to the position leading to the reference voltage terminal 5 and the other is switched to the position leading to the ground terminal GND. One of the switches S34m and S35m is switched to the position leading to the reference voltage terminal 5, and the other is switched to the position leading to the ground terminal GND. In a series of such operations, switching of the switches on the non-inverting signal side and the inverting signal side is performed at the same timing.

A switching state and operation timing of each switch when a D/A conversion operation is performed by the cyclic A/D converter device 41 which is configured as described above are generally the same as the switching states illustrated in FIGS. 14A, 14B, 14C, and 14D and the operation timing illustrated in FIG. 15, respectively.

As described above, according to the differential-type cyclic A/D converter device 41, the same advantage as in the second embodiment can be provided. Since the differential-type cyclic A/D converter device 41 performs the A/D conversion of the difference voltage of the input signal voltages Vinp and Vinm, it is possible to effectively remove a common mode noise entering from the external side, and to prevent an erroneous conversion by a noise from occurring. Also in the D/A conversion operation, since the analog voltage corresponding to a binary code value is outputted in a differential mode, it is possible to effectively remove a common mode noise. The non-inverting signal side and the inverting signal side have a symmetrical layout and moreover are operated at the same timing. Accordingly, even if there is an injection of an unwanted charge due to a feed-through at the time of switching of each switch for example, an error caused by the charge injection can be cancelled out by the differential operation. Consequently, it is possible to further improve accuracy of the A/D conversion and the D/A conversion.

(Fourth Embodiment)

A fourth embodiment of the present invention is described next with reference to FIGS. 17 and 18, in which the same sign is attached to the same member of the foregoing embodiments.

Figure 17:
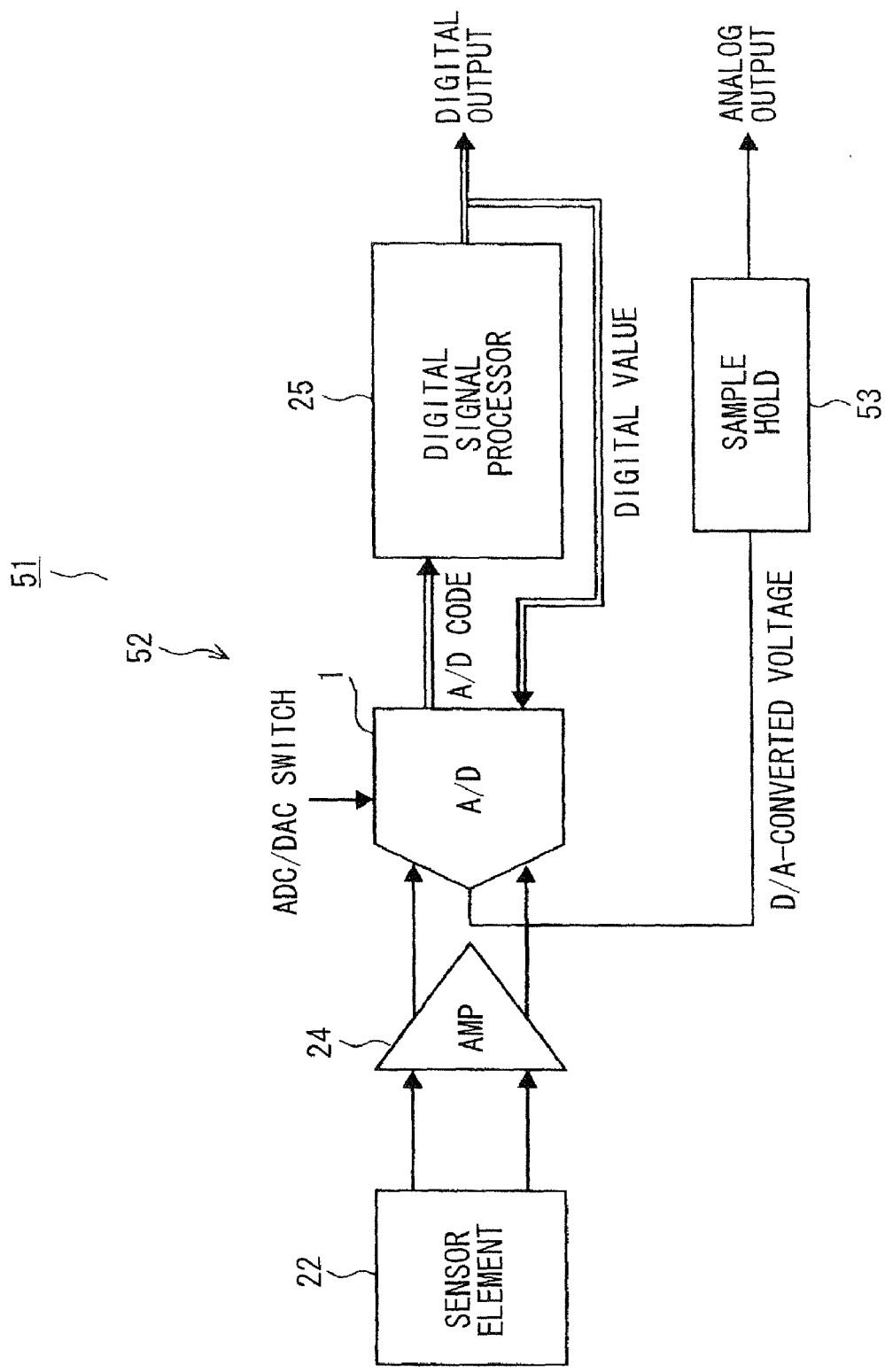
FIG. 17 is a block diagram illustrating outline structure of a sensor device which employs a cyclic A/D converter device according to a fourth embodiment of the present invention.
Figure 18:
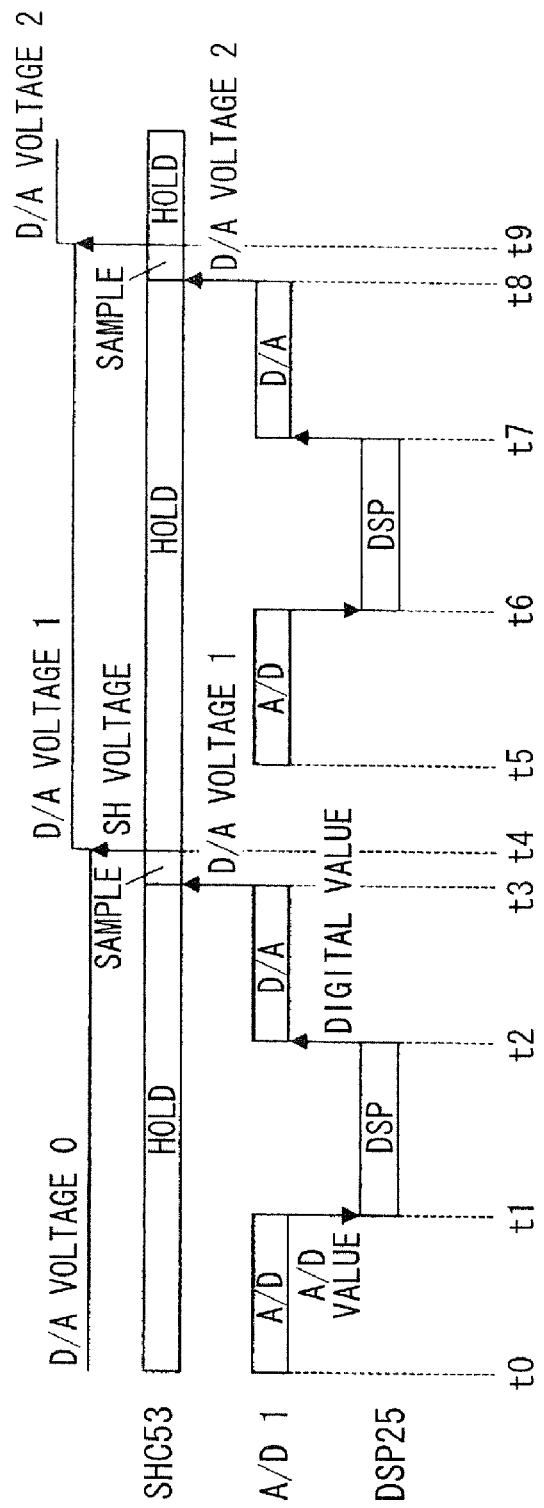
FIG. 18 is a time chart illustrating first operation timing of a sensor device with an analog output format in the fourth embodiment.

Referring to FIG. 17, a sensor device 51 of the fourth embodiment is different from the sensor device 21 of the first embodiment, in the point that the sensor device 51 includes a signal processing unit 52 in place of the signal processing unit 23. The signal processing unit 52 includes an amplifier circuit 24, a cyclic A/D converter device 1, a digital signal processor circuit 25, and a sample hold circuit (SHC) 53. An analog voltage outputted from the A/D converter device 1 is outputted to the external side of the sensor device 51 via the sample hold circuit 53. The sample hold circuit 53 samples an inputted analog voltage and holds the sampled analog voltage for a prescribed period.

Next, the operation of the A/D converter device 1 in a case of the sensor device 51 functioning as a device with an analog output format is described with reference to FIG. 18, which illustrates the operation timing of the A/D converter device 1, the digital signal processor circuit 25, and the sample hold circuit 53.

First, the A/D converter device 1 is controlled to input an output voltage of the amplifier circuit 24 and to perform an A/D conversion operation (time t0 to t1).

After that, the digital signal processor circuit 25 is controlled to perform the signal processing to the A/D conversion value (digital value) outputted by the A/D converter device 1 (time t1 to t2). Then, the A/D converter device 1 is controlled to input the output signal of the digital signal processor circuit 25 and to perform a D/A conversion operation (time t2 to t3).

The sample hold circuit 53 samples the analog voltage outputted by the A/D converter device 1, and outputs the sampled analog voltage to the external side (time t3 to t4). The output voltage of the sample hold circuit 53 is held for a period until the next sampling operation is completed (during time t4 to t9). In time t4 and later, as is the case with time t0 to t4, the A/D conversion operation by the A/D converter device 1, the signal processing by the digital signal processor circuit 25, the D/A conversion operation by the A/D converter device 1, and the sample-and-hold operation by the sample hold circuit 53 are repeated in order.

In the sensor device 21 of the first embodiment, when the signal processing unit 23 functions as a device with an analog output format, the A/D converter device 1 is switched, by time sharing, between the state of an A/D conversion operation and the state of a D/A conversion operation. Although an analog voltage is outputted from A/D converter device 1 during the A/D conversion operation, the analog voltage is an intermediate output of the processing, and not a final output. Therefore, in the subsequent-stage circuit which receives the output of the signal processing unit 23, it is necessary to provide a function to extract only the analog voltage of the final output required. In order to satisfy the requirement, the signal processing unit 52 of the sensor device 51 of the fourth embodiment includes the sample hold circuit 53, which samples an analog voltage outputted when the D/A conversion operation is performed by the A/D converter device 1, holds the sampled analog voltage for a prescribed period, and outputs the held analog voltage to the external side. By providing the sample hold circuit 53, only an analog voltage outputted by the D/A conversion operation, which is an analog voltage to be outputted primarily to the external side, is sampled and held for a period of the A/D conversion operation, and the held analog voltage is outputted. Therefore, it is possible to output only the final output to the external side. Accordingly, it is possible to simplify processing in a circuit provided in the latter stage of the sensor device 51.

(Fifth Embodiment)

A fifth embodiment of the present invention is described next with reference to FIG. 19, in which the same sign is attached to the same member of the foregoing embodiments.

Figure 19:
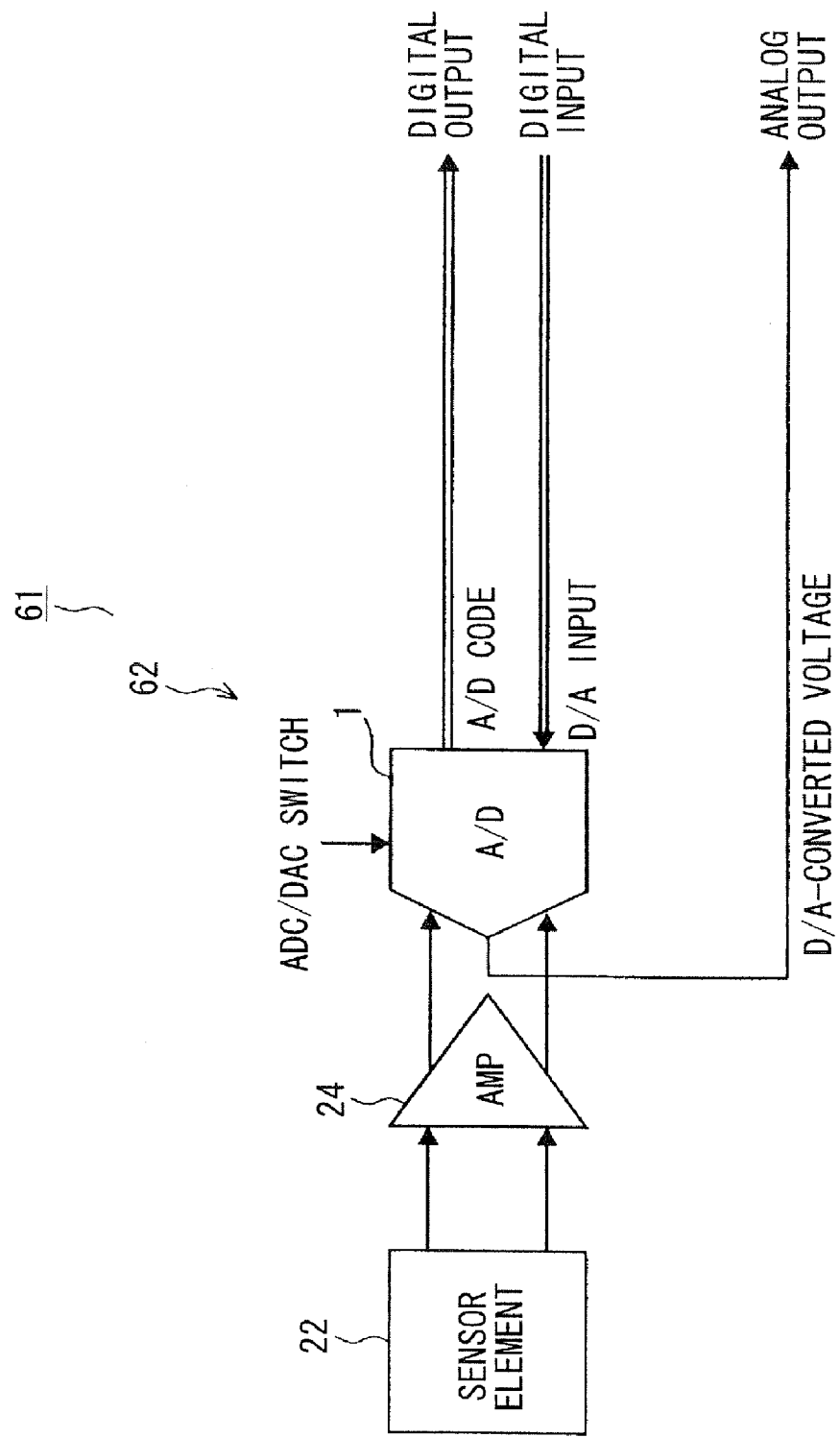
FIG. 19 is a block diagram illustrating outline structure of a sensor device which employs a cyclic A/D converter device according to a fifth embodiment of the present invention.

Referring to FIG. 19, a sensor device 61 of the fifth embodiment is different from the sensor device 21 of the first embodiment in that the sensor device 61 includes a signal processing unit 62 in place of the signal processing unit 23. The signal processing unit 62 includes the amplifier circuit 24 and the cyclic A/D converter device 1, but does not include the digital signal processor circuit 25. That is, the sensor device 61 does not perform signal processing to an output signal of the sensor element 22, but outputs a digital signal (digital conversion value) corresponding to the output signal. Therefore, the digital conversion value outputted by the A/D converter device 1 is outputted to the external side of the sensor device 61.

When an ADC/DAC function switching signal instructing execution of a D/A conversion operation is supplied, the A/D converter device 1 performs a D/A conversion operation which outputs an analog voltage produced by performing D/A conversion of the digital value (binary code value) supplied from the external side of the sensor device 61. This digital value may be associated or completely not associated with an output signal of the sensor element 22. The analog voltage outputted by the A/D converter device 1 is outputted to the external side of the sensor device 61.

By employing the A/D converter device 1 so that an A/D conversion operation may be always executed, the signal processing unit 62 of the sensor device 61 can execute a digital output operation which outputs a digital signal produced by the A/D conversion of the analog signal outputted by the sensor element 22. Accordingly, it is possible to make the sensor device 61 function as a device with a digital output format. By employing the A/D converter device 1 so that a D/A conversion operation may be always executed, the signal processing unit 62 can execute an analog output operation which converts a digital signal (binary code value) supplied from the external side into an analog voltage, and output the converted analog voltage. Accordingly, it is possible to configure the sensor device 61 provided with a D/A conversion function.

In the sensor device 61, an output signal of the sensor element 22 is A/D-converted, and the A/D-converted digital signal is inputted to an external signal processor circuit (not illustrated). In the external signal processor circuit, predetermined digital signal processing is performed to the digital signal, and the digital signal after the signal processing is inputted to the sensor device 61. In the sensor device 61, the digital signal after the signal processing is D/A-converted, and the D/A-converted analog voltage is outputted to the external side. The sensor device 61 can thus be operated as a sensor device with an analog output format in cooperation with the external signal processor circuit.

(Other Embodiments)

The present invention is not limited to the embodiments, which have been described above, but may be modified in many ways.

For example, when performing a D/A conversion operation in the A/D converter device 1, the capacitor CF2 may function as the third capacitor instead of the capacitor CF1. The resolution of the A/D converter circuit 2 is not limited to 1.5 bits, but may be suitably changed.

The signal processor circuits 23, 52, and 62 may be configured with the cyclic A/D converter devices 31 or 41, instead of the cyclic A/D converter device 1.

When the second operation pattern of the analog output format is executed, the average value Dave calculated by the digital signal processor circuit 25 is not limited to the average of three times of the digital values, but may be the average of two times of the digital values, or the average of more than three times of the digital values.

When operating the sensor device 21 as a device with an analog output format, the sensor device 21 may be operated in operation patterns other than the first and the second operation patterns. For example, it is also preferable to repeat the steps in which, after an A/D conversion operation is performed once, two or more of mutually-different signal processing are performed and then a D/A conversion operation is performed.

The cyclic A/D converter device 1 in the first embodiment can be configured so that a differential operation may be possible, as is the case with the cyclic A/D converter device 41 in the third embodiment.

The present invention is applicable not only to a signal processing unit provided in a sensor device, but also to various kinds of signal processing units provided with a signal processor circuit which performs predetermined signal processing to a digital signal.

What is claimed is:

1. An A/D converter device comprising:
an A/D converter circuit;
a residual voltage generator circuit operable to generate a residual voltage by amplifying a difference voltage of an input voltage and a predetermined analog voltage;
an input switching circuit operable to input one of an external signal voltage and a voltage outputted by the residual voltage generator circuit, to the A/D converter circuit and the residual voltage generator circuit; and
a control circuit operable to control execution of an A/D conversion operation and a D/A conversion operation,
wherein the A/D conversion operation includes A/D conversion, which sets an analog voltage in the residual voltage generator circuit as a D/A conversion value of a digital conversion value outputted from the A/D converter circuit, and circulates the external signal voltage through the input switching circuit, the A/D converter circuit and the residual voltage generator circuit, and
wherein the D/A conversion operation includes D/A conversion, which sets an analog voltage in the residual voltage generator circuit as a voltage corresponding to a binary code value supplied from an external side, circulates the analog voltage outputted from the residual voltage generator circuit through the input switching circuit and the residual voltage generator circuit, and outputs from the residual voltage generator circuit the analog voltage corresponding to the binary code value.

2. The A/D converter device of claim 1, wherein:
the residual voltage generator circuit includes
a capacitor array circuit including a first capacitor and a second capacitor, one ends of the first capacitor and the second capacitor being connected to a common line as common-side electrodes, and the other ends being connected to one of a plurality of reference voltage lines and the input switching circuit as non-common-side electrodes,
an operational amplifier operable to input a voltage of the common line to output the residual voltage, and
a third capacitor connectable between an input terminal and an output terminal of the operational amplifier; and
the control circuit controls execution of the A/D conversion operation, by
setting up a charge corresponding to the external signal voltage to a capacitor selected from the third capacitor, and the first capacitor and the second capacitor, via the input switching circuit,
initializing remaining capacitors other than the selected capacitor,
performing charge re-distribution between the first capacitor and the second capacitor, and the third capacitor, by connecting the non-common-side electrodes of the first capacitor and the second capacitor to one of the reference voltage lines, respectively, according to a conversion result of the A/D converter circuit, in a state where the third capacitor is connected between the input terminal and the output terminal of the operational amplifier, and
repeating subsequently the charge setup corresponding to the residual voltage outputted from the operational amplifier, the initialization, and the charge re-distribution, for a required number of times.

3. The A/D converter device of claim 2, wherein:
the residual voltage generator circuit includes
a charge divider circuit operable to store a charge, to divide the stored charge by a ratio set up in advance, and to store the charge again, and
a charge integrator circuit operable to store a charge, to add the stored charge to the stored charge of the charge divider circuit, and to store the added charge again; and
the control circuit controls execution of the D/A conversion operation, in which a reference voltage is converted to an analog voltage corresponding to a binary code value and the converted analog voltage is outputted, by
storing a charge corresponding to a reference voltage to the charge divider circuit and initializing a stored charge of the charge integrator circuit at the beginning, and
executing a charge division operation by the charge divider circuit, according to each bit in order from the MSB of the binary code and executing a charge adding operation by the charge integrator circuit, corresponding to the data value of each bit.

4. The A/D converter device of claim 3, wherein:
the charge divider circuit includes
the operational amplifier,
the first capacitor connectable between the input terminal and the output terminal of the operational amplifier, and operable to set up a charge corresponding to the reference voltage, and
the second capacitor connectable between the input terminal and the output terminal of the operational amplifier, and operable to set up a predetermined charge, without affecting the stored charge of the first capacitor; and
the control circuit controls execution of charge division operation by the charge divider circuit, by connecting the first capacitor and the second capacitor between the input terminal and the output terminal of the operational amplifier.

5. The A/D converter device of claim 4, wherein:
the charge integrator circuit includes
the operational amplifier,
the first or the second capacitor, and
the third capacitor operable to set up a predetermined initial charge; and
the control circuit controls execution of charge adding operation by the charge integrator circuit, by transferring a charge stored in the first or the second capacitor to the third capacitor.

6. The A/D converter device of claim 2, wherein:
the residual voltage generator circuit includes
a charge integrator circuit operable to store a charge, and operable to cumulatively add to stored charge a charge corresponding to a reference voltage or a predetermined charge different from the charge, according to a bit data value of the binary code, and
a charge divider circuit operable to divide the stored charge of the charge integrator circuit by a ratio set up in advance, and operable to store the charge again; and
the control circuit controls execution of the D/A conversion operation in which a reference voltage is converted to an analog voltage corresponding to a binary code value and the converted analog voltage is outputted, by initializing a stored charge of the charge integrator circuit; and executing a charge integration operation by the charge integrator circuit and a charge division operation by the charge divider circuit, according to a data value of each bit in order from the LSB of the binary code.

7. The A/D converter device of claim 6, wherein:

the charge integrator circuit and the charge divider circuit include the operational amplifier, the first capacitor and the second capacitor connectable between the input terminal and the output terminal of the operational amplifier, and operable to set up a charge corresponding to the reference voltage or a predetermined charge different from the charge, and the third capacitor connectable between the input terminal and the output terminal of the operational amplifier, and operable to initialize a charge; and the control circuit executes addition and division of the stored charge of the first capacitor and the second capacitor, and the third capacitor by initializing a charge of the third capacitor at the beginning, setting up to the first capacitor and the second capacitor, according to each bit in order from the LSB of the binary code, a charge corresponding to the reference voltage or a predetermined charge different from the charge concerned corresponding to the data value of each bit concerned, and connecting the first capacitor and the second capacitor, and the third capacitor between the input terminal and the output terminal of the operational amplifier.

8. The A/D converter device of claim 1, wherein:

the A/D converter circuit, the residual voltage generator circuit, and the input switching circuit are operable to perform a differential operation, respectively.

9. A signal processing unit comprising:

the A/D converter device of claim 1; and a signal processor circuit operable to execute a digital output operation and an analog output operation, wherein in the digital output operation, after setting the A/D converter device to perform the A/D conversion operation, an analog signal supplied from the external side is inputted to the A/D converter device, and a digital conversion value outputted by the A/D conversion operation concerned is outputted to the external side, and wherein in the analog output operation, after setting the A/D converter device to perform the D/A conversion operation, a digital signal supplied from the external side is inputted to the A/D converter device, and an analog voltage outputted by the D/A conversion operation concerned is outputted to the external side.

10. A signal processing unit comprising:

the A/D converter device of claim 1; and a signal processor circuit operable to perform predetermined signal processing to a digital signal inputted, wherein the signal processor circuit is operable to execute a digital output operation and an analog output operation, wherein in the digital output operation, after setting the A/D converter device to perform the A/D conversion operation, an analog signal supplied from the external side is inputted to the A/D converter device, a digital conversion value outputted by the A/D conversion operation concerned is inputted to the signal processor circuit, and a digital signal outputted by the signal processing concerned is outputted to the external side, and wherein in the analog output operation, after setting the A/D converter device to perform the A/D conversion operation, an analog signal supplied from the external side is inputted to the A/D converter device, a digital conversion value outputted by the A/D conversion operation concerned is inputted to the signal processor circuit, and, after setting the A/D converter device to perform the D/A conversion operation, a digital signal outputted by the signal processing concerned is inputted to the A/D converter device, and an analog voltage outputted by the D/A conversion operation concerned is outputted to the external side.

11. The signal processing unit of claim 10, further comprising:

a sample hold circuit operable to sample an analog voltage outputted when the D/A conversion operation is performed by the A/D converter device, operable to hold the sampled analog voltage for a prescribed period, and operable to output the held analog voltage concerned to the external side.

* * * * *